US012729439B2

(12) United States Patent
Scherschlicht et al.

(10) Patent No.: US 12,729,439 B2
(45) Date of Patent: Sep. 8, 2026

(54) METHOD FOR OPERATING A COATING SYSTEM FOR PRODUCING LAYER SYSTEMS

(71) Applicant: RODENSTOCK GMBH, Munich (DE)

(72) Inventors: Rüdiger Scherschlicht, Unterhaching (DE); Stefan Radünz, Gilching (DE)

(73) Assignee: Rodenstock GmbH (DE)

(*) Notice: Subject to any disclaimer, the term of this patent is extended or adjusted under 35 U.S.C. 154(b) by 297 days.

(21) Appl. No.: 17/774,995

(22) PCT Filed: Dec. 18, 2020

(86) PCT No.: PCT/EP2020/087007
§ 371 (c)(1),
(2) Date: May 6, 2022

(87) PCT Pub. No.: WO2021/123154
PCT Pub. Date: Jun. 24, 2021

(65) Prior Publication Data

US 2022/0396878 A1 Dec. 15, 2022

(30) Foreign Application Priority Data

Dec. 19, 2019 (DE) ..................... 10 2019 135 195.2

(51) Int. Cl.
*C23C 16/52* (2006.01)
*B29D 11/00* (2006.01)
(Continued)

(52) U.S. Cl.
CPC ........ *C23C 16/52* (2013.01); *B29D 11/00865* (2013.01); *B29D 11/0098* (2013.01);
(Continued)

(58) Field of Classification Search
CPC ....... C23C 14/54; C23C 14/547; C23C 16/52; G01B 11/0616; G02B 1/115
See application file for complete search history.

(56) References Cited

U.S. PATENT DOCUMENTS 6,217,720 B1 4/2001 Sullivan et al.
9,709,386 B1 7/2017 Nicolaides et al.
(Continued)

FOREIGN PATENT DOCUMENTS

DE 10 2011 084 996 A1 4/2013
EP 3346023 * 11/2018
(Continued)

OTHER PUBLICATIONS

International Search Report, issued in PCT/EP2020/087007, dated Apr. 14, 2021.

(Continued)

*Primary Examiner* — Tabassom Tadayyon Eslami
(74) *Attorney, Agent, or Firm* — Dorton & Willis, LLP

(57) ABSTRACT

A method for operating a coating system for producing layer systems includes the steps of: (i) coating a layer system in a coating facility; (ii) determining a spectral actual measuring plot for the layer system in an optical measuring system; (iii) determining an actual data set by fitting a simulation target measuring plot to the actual measuring plot; (iv) determining actual layer parameters as computed actual layer parameters from the simulation target measuring plot by simulation of the layer system using the actual data set; (v) outputting the actual data set and the computed actual layer parameters at least to a decision system; (vi) providing quality requirement data; and (vii) deciding on an approval of the layer system in the decision system on the basis of a comparison of at least the actual data set, the computed
(Continued)

Figure 1:
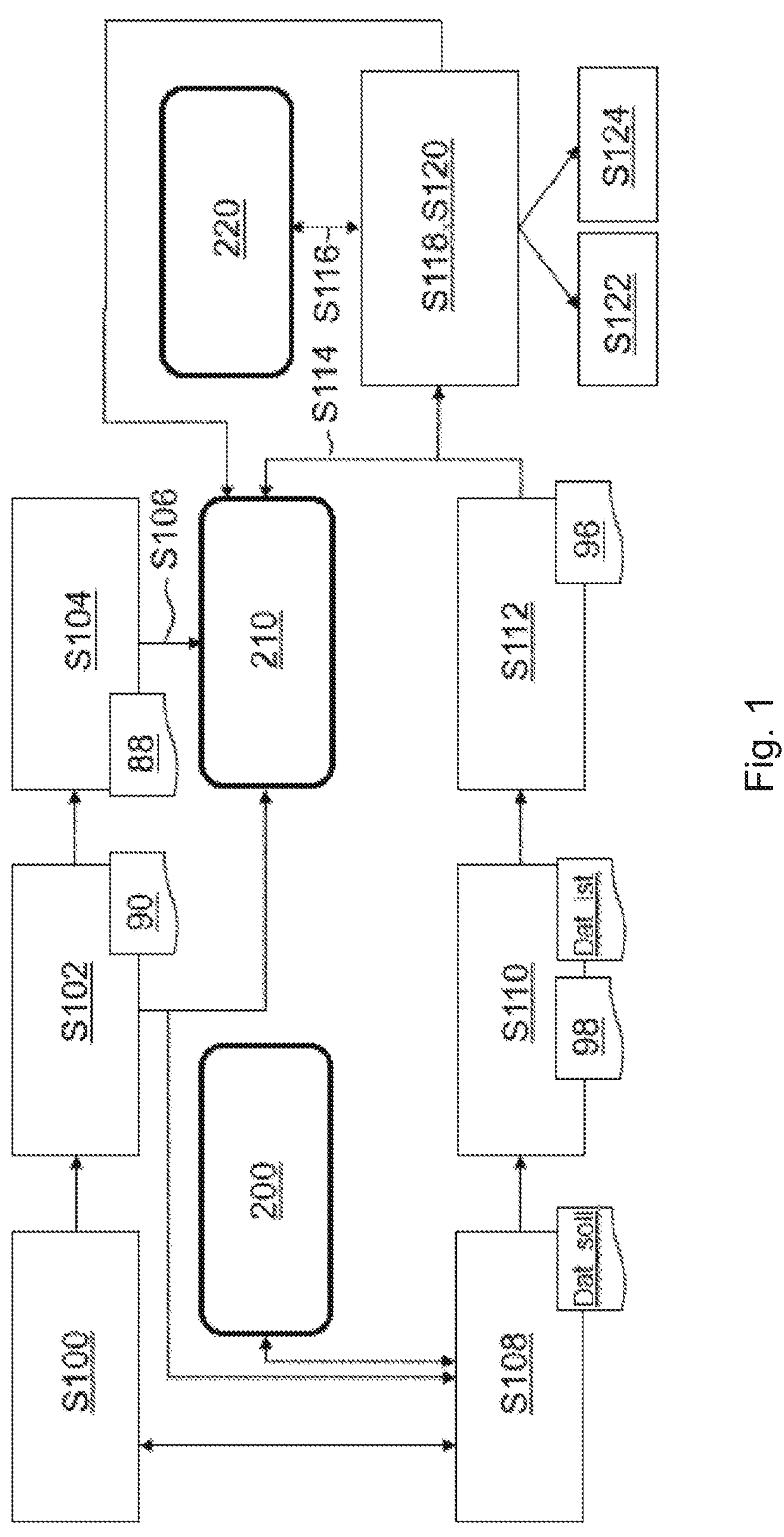

actual layer parameters and the quality requirement data. A coating system for producing layer systems is also disclosed.

21 Claims, 11 Drawing Sheets

(51) Int. Cl.
*C23C 14/00* (2006.01)
*C23C 14/54* (2006.01)
*C23C 16/00* (2006.01)
*G02B 1/115* (2015.01)

(52) U.S. Cl.
CPC .......... *C23C 14/0015* (2013.01); *C23C 14/54* (2013.01); *C23C 16/006* (2013.01); *G02B 1/115* (2013.01)

(56) References Cited

U.S. PATENT DOCUMENTS

2015/0021168 A1* 1/2015 Lotz .................... H01J 37/347
204/298.03
2019/0127845 A1 5/2019 Shuto et al.

FOREIGN PATENT DOCUMENTS

JP 2017-218674 A 12/2017
WO WO 2016/110339 A1 7/2016
WO WO 2018/127543 A1 7/2018
WO 2018/127543 * 12/2018

OTHER PUBLICATIONS

Lazzaroni, "A Tool for Quality Controls in Industrial Process" I2MTC 2009—International Instrumentation and Measurement Technology Conference, Singapore, May 5-7, 2009, pp. 68-73.
English translation of the Japanese Office Action for Japanese Application No. 2022-526086, dated Jan. 9, 2024.

* cited by examiner

| No. | Text | Num. | Req. |
|---|---|---|---|
| 1.1 | T1 | N1 | R1 |
| 1.2 | T2 | N2 | R2 |
| 1.3 | T3 | N3 | R3 |
| 1.4 | T4 | N4 | R4 |

Fig. 3

METHOD FOR OPERATING A COATING SYSTEM FOR PRODUCING LAYER SYSTEMS

STATE OF THE ART

The invention relates to a method for operating a coating system for producing layer systems. The invention also relates to a coating system for producing layer systems, a computer program product for a method for operating a coating system, and a data processing system for carrying out a method for operating a coating system for producing layer systems.

A coating method implemented in a manufacturing environment with an underlying coating process usually has deviations from coating batch to coating batch. These deviations are due to the fact that the condition of the coating facility changes slightly, for example due to deposits of coating material on the walls of the vacuum chamber, operator influences when loading the coating facility with coating material, wear and tear of various components installed in the coating facility, and the like.

Reflection plots measured for most coating batches are usually stored in production monitoring tools. These plots can be evaluated within the production monitoring tool with regard to Rm (mean reflectance, Rv (visual reflectivity) and their colour values, and the corresponding values can be saved. The same applies to other input values, such as transmission value, cross-cut value, etc. For different layer variants, quality relevant variables can be indirectly determined from an approval point of view, for example.

Known optical elements with interferometric antireflection coating, such as those known from WO 2016/110339 A1, usually have a light reflection degree of approximately 1%, computed according to the standard DIN EN ISO 13666:2013-10. The colour of the residual reflection that remains can show a large variation when the viewing angle is changed. The variation can span the entire visual colour gamut.

DISCLOSURE OF THE INVENTION

The object of the invention is to provide a method for operating a coating system for producing layer systems, which includes aspects relevant to quality.

Further objects of the invention are to provide a coating system as well as a computer program product and a data processing system for carrying out such a method.

The objects are solved by the features of the independent claims. Favourable configurations and advantages of the invention result from the further claims, the description, and the drawing.

The invention is particularly useful for producing optical elements. It should be understood that the method according to the invention is neither limited to producing optical elements and coatings nor to the deposition of multilayer systems. Likewise, the substrate on which the layer system is deposited can be transparent or non-transparent, as required.

Furthermore, the invention can be used for a layer system that consists of an individual layer that is deposited on a substrate and has a layer thickness. This does not preclude an adhesion promoter layer being arranged between the individual layer and the substrate and/or the individual layer being covered with a protective layer. A possible adhesion promoter layer and/or protective layer does not have an influence or at least no significant influence on the examined properties of the layer system with the one individual layer.

Alternatively, the layer system can be formed from several individual layers which are deposited one on top of the other on a substrate and in which the individual layers each have layer thicknesses which can be the same or different from one another. Here, too, an adhesion promoter layer can be arranged between the individual layer closest to the substrate and the substrate and/or the layer system can be covered with a protective layer. The possible adhesion promoter layer and/or protective layer does not have an influence or at least no significant influence on the examined properties of the layer system with the several individual layers.

Optionally, intermediate layers can also be provided as adhesion promoters between the substrate and the layer system, for example, a conventional paint system, such as hard paint, primer paint, buffer paint, etc.

Unless otherwise stated, the terms used in this disclosure should be understood within the meaning of the standard DIN EN ISO 13666:2013-10 (EN ISO 13666:2012 (D/E)) and DIN EN ISO 11664-4:2012-06 (EN ISO 11664-4:2011) of the German Institute for Standardisation e.V.

According to Section 4.2 of the standard DIN EN ISO 13666:2013-10, the term visible light, visible radiation or a visible wavelength range refers to optical radiation that is able to directly cause a light sensation in humans. Visible radiation generally refers to a wavelength range from 400 nm to 780 nm.

Within the scope of this disclosure, visible radiation can preferably refer to a wavelength range of 400 nm or 460 nm to 700 nm, corresponding to the maximum sensitivity of the human eye. At the same time, the design flexibility for the configuration of the filter properties and edge steepness can be increased.

According to Section 15.1 of the standard DIN EN ISO 13666:2013-10, the term spectral reflectance, reflectance or reflectivity refers to the ratio of the spectral radiant power reflected by the respective material or the surface or coating to the incident radiant power for a specific wavelength ($\lambda$).

In the present case, the reflectivity refers to the reflectivity of the entire coating with its several highly refractive and low refractive partial layers and not to the reflectivity of an individual partial layer.

According to a first aspect of the invention, a method for operating a coating system for producing layer systems is proposed, comprising (i) coating a layer system in a coating facility;

(ii) determining a spectral actual measuring plot for the layer system in an optical measuring system;

(iii) determining an actual data set by fitting a simulation target measuring plot to the actual measuring plot;

(iv) determining actual layer parameters as computed actual layer parameters from the simulation target measuring plot by simulation of the layer system using the actual data set;

(v) outputting the actual data set and the computed actual layer parameters at least to a decision system;

(vi) providing quality requirement data;

(vii) deciding on an approval of the layer system in the decision system on the basis of a comparison of at least the actual data set, the computed actual layer parameters and the quality requirement data.

Advantageously, the method according to the invention enables a self-controlled and feedback mode of operation of coating systems under aspects relevant to quality.

The decision system can be designed as a separate processor. However, the decision system can also be implemented, for example, not as separate hardware, but as a process on the control computer of the coating system.

The actual measuring plot can be determined by spectral measurement of the layer system produced in the optical measuring system.

Because the actual data set of the coating system is determined by fitting the simulation target measuring plot to the actual measuring plot, the actual data set can comprise the coating parameters of the coating system computed back from the layer system produced.

The actual layer parameters are computed from the simulation target measuring plot by simulating the layer system with the actual data set.

A target data set for the coating system can be in a design database and can comprise an original design (coating parameters) of the coating to be produced. The target data set can then comprise at least the facility actual layer thicknesses of the one or more individual layers assigned to the one or more individual layers.

The target data set with the target measuring plot contains the target data for the optimal coating. In addition to a spectrally resolved optical measurement, this data can also contain other target variables, such as the colour values L*, C* and h* in the visible spectral range and/or defined, computable spectral variables, such as averaged or weighted transmission and/or reflection values in any interval to be defined.

Furthermore, the target data set contains coating specific spectral intervals nested from small to large. The largest possible specified interval reflects the maximum spectral viewing range. The number of intervals can be freely selected. The target data set contains characteristic spectral points that clearly fix the optical layout of the coating.

The target measuring plot can contain spectral target data of the layer system to be produced.

A target layer thickness can comprise a target layer thickness of the layer system to be produced.

A simulation actual data set comprises at least the one simulation actual layer thickness of one of the individual layers of the layer system determined in an iterative optimisation method or the simulation actual layer thicknesses of the several individual layers of the layer system. The simulation actual data set is used for back-computation of the simulation target measuring plot to the target measuring plot.

A simulation actual measuring plot comprises at least one simulated spectral measuring plot, which represents the best possible match with the optical measurement carried out as an actual measuring plot.

The actual measuring plot in the simulation actual measuring plot is at least approximated by the simulation actual layer thickness.

The simulation target data set comprises at least the simulation target layer thicknesses of the several individual layers determined in the iterative optimisation method or the simulation target layer thickness of the one individual layer with the best possible match with the target measuring plot with offsetting over the simulation target set. The adjusted one or more simulation target layer thicknesses of this data set represent the process parameters for the following coating batch.

For this purpose, the simulation target data set comprises the adjusted computation parameters of the simulated layer system for ideal layers and/or ideal processes, material properties, such as ideal refractive index values and ideal deposition conditions, as well as facility parameters, such as coating geometry, layer thickness control, etc.

The simulation target measuring plot comprises at least one simulated spectral measuring plot that represents the best possible match between the target measuring plot and the simulation actual measuring plot.

The target measuring plot in the simulation target measuring plot is at least approximated by the simulation target layer thickness.

The facility data set comprises at least the actual layer thicknesses of the several individual layers adjusted at the coating facility, if the layer system is formed from several individual layers, or the actual layer thickness of the one individual layer adjusted at the coating facility, if the layer system is formed from only one individual layer.

The facility actual layer thicknesses can be the layer thicknesses of the layer system to be produced adjusted at the coating facility.

Correction actual layer thicknesses can represent the new facility actual layer thicknesses, which are determined from the final simulation target layer thicknesses with the final simulation target data set, in order to produce a next layer system.

Approval criteria can be, for example, standards, patent rights, such as patent applications, utility models, granted patents, etc. The patent rights are based, for example, on claim features. Claim features comprise features from which numerical values can be derived and can be checked automatically. Approval criteria are in a criteria database in which, for example, standards and/or patent specifications with their claim features that can be represented numerically can be stored.

However, the approval criteria can advantageously also comprise other features, such as compliance with specified optical data by spectrally verifiable variables, tolerance parameters, or deviations in coating parameters.

Approval criteria can thus comprise at least permissible and/or non-permissible layer parameters, in particular, from which requirements are derived, which are used for the comparison with the actual data set and/or the computed actual layer parameters and/or the actual measuring plot.

Quality requirement data can be defined on the basis of the approval criteria, quality requirement data can comprise tolerance values for the target data set of a layer system.

In this way, parameters for an approval decision can be used that cannot be determined directly due to equipment conditions or because the measurements are too complex. Efficient software-based quality assurance can thus be carried out.

The quality requirement data can in particular be loaded from a criteria database.

Optionally, colour values of a residual reflection colour of the layer system can also be computed from the actual measuring plot.

The coating system can be used favourably for producing layer systems, for example for optical elements. In this case, the spectral measuring plot comprises measurement of a spectral reflection plot over a wavelength range that lies in particular in the visible range, wherein the simulation target measuring plot corresponds to a simulated spectral reflection plot in the same wavelength range.

The field for coatings is increasingly restricted by regulations, which are, among others, specified by standards, but also by patents. For example, there are a large number of patents that protect different characteristics of coatings in the ultraviolet spectral range.

It is important to monitor compliance with these regulations both during the development phase of new coatings and later in the product life cycle when producing batches of these new coatings. Monitoring the same means not only checking and documenting the test values as before, but also the non-approval of coatings during the development phase or of coating batches in the manufacturing process in the event of non-conformity with those regulations.

In contrast to known methods, which work at conventional coating facilities with optical in-line or online monitoring for the correction of optical layers during the coating process, the method according to the invention can extract a correction suggestion quasi "posthumously" from the data of the previous coating run (Run n) for the next coating run (Run n+1). In addition, the thickness ratios of the individual optical layers to one another can be retained.

In addition, there is no "arbitrary" correction to a target plot, but an intelligent correction that takes existing layer thickness ratios into account and, thus, main layer properties are retained. Last but not least, legal bases, such as CE approvals and the like, can also be advantageously fulfilled and maintained.

The method according to the invention advantageously enables such an approval decision by a software-based process. This approval decision can be made automatically based on stored test routines. These test routines check the quality requirement data on the basis of approval criteria, which can comprise, for example, standards, patent rights, such as applications, utility models, granted patents, etc.

The patent rights are based, for example, on claim features. Claim features from which numerical values can be derived can be checked automatically. This software-based quality assurance comprises a criteria database in which, for example, standards and/or patent specifications can be stored with their claim features that can be represented numerically.

However, the approval criteria can advantageously also comprise other features, such as compliance with specified optical data by spectrally verifiable variables, tolerance parameters, or deviations in coating parameters.

A finished layer system whose layer structure is known can be checked for conformity with the features contained in the criteria database. In order to be able to check for features that cannot be derived from measurements, such as reflection measurements on the layer system, or whose data are not available, the measurement can be simulated using software. The software-based quality assurance includes this simulation step.

The reliability of the statements can be ensured by comparing the simulation and existing measurements.

According to an advantageous embodiment, the method can also comprise at least the steps of (i) computing colour values of a residual reflection colour of the layer system from the actual measuring plot; (ii) filing the actual measuring plot and the computed colour values in a filing database; (iii) loading a target data set with a design of the completed coating of the layer system from a design database and the actual measuring plot into a simulation computer; (iv) determining the actual data set by fitting the simulation target measuring plot to the actual measuring plot in the simulation computer; (v) outputting the actual data set and the computed actual layer parameters to the decision system and to the filing database; (vi) loading approval criteria for layer systems from a criteria database, which are used for the comparison of at least the actual data set (Dat_ist), the computed actual layer parameters (96) and the quality requirement data; (vii) documenting the decision on approval in the filing database.

For example, the design can at least comprise: a first material for highly refractive first individual layers and a second material for low refractive second individual layers, the number of desired layer packets with the individual layers, starting values for the thickness of the individual layers.

According to an advantageous embodiment of the method according to the invention, the approval criteria can comprise at least permissible and/or non-permissible layer parameters, in particular, from which requirements are derived, which are used for the comparison with the actual data set and/or the computed actual layer parameters and/or the actual measuring plot.

In this way, regulatory or normative criteria can be included in the approval process. In particular, those criteria can be used whose specifications cannot be derived from facility-relevant parameters.

According to an advantageous embodiment of the method according to the invention, the quality requirement data can comprise tolerance values for the target data set of a layer system. Thereby it is possible to produce coating batches with constant optical measurement values, or to make appropriate corrections at an early stage, if facility parameters change.

According to an advantageous embodiment of the method according to the invention, the deciding on an approval of the layer system in the decision system can comprise an automatic, software-based approval decision, in particular, by using an artificial intelligence method. The method according to the invention advantageously enables approval decisions with a high degree of automation through a software-based process. The approval decisions can be made automatically based on stored test routines. The test routines can, for example, be automatically adapted and further developed on the basis of knowledge based on constantly changing criteria databases.

According to an advantageous embodiment of the method according to the invention, the deciding on a coating of a layer system in a coating facility can be made based on a comparison of at least the target data set and approval criteria from the criteria database.

Such an approval decision can be made early in the design process during development, whereby the costs of production, can be saved, which may not be able to be used afterwards.

According to an advantageous embodiment of the method according to the invention, the computed actual layer parameters can comprise reflection values in wavelength ranges outside of the actual measuring plot, in particular, in the UV wavelength range, and/or reflection values at different angles of incidence. Such a procedure is based on derived variables for the quality requirement data based on the approval criteria.

In this way, parameters for an approval decision can be used that cannot be determined directly due to equipment conditions or because the measurements are too complex. Efficient software-based quality assurance can thus be carried out.

According to an advantageous embodiment of the method according to the invention, the coating of a layer system in a coating system can comprise that an interferometric layer system is deposited on at least one surface of a substrate.

Here, the layer system can comprise a stack of at least four successive layer packets, wherein each layer packet comprises a pair of first and second individual layers, wherein the first individual layers each have a first optical thickness and the second individual layers each have a second optical thickness, which is different from the first optical thickness. A refractive index of the respective first individual layers, which are closer to the substrate, can be greater than a refractive index of the respective second individual layers of the stack, which are further away from the substrate.

In particular, the interferometric layer system can be designed as a reflection-reducing or reflection-enhancing layer system.

The layer system can have a brightness L*, a chromaticity C*, and a hue angle h of a residual reflection colour, wherein the amount of a change Δh of the hue angle h of the residual reflection colour in an interval of a viewing angle with the limit values of 0° and 30° in relation to a surface normal on the layer system is smaller than the amount of a change ΔC*of the chromaticity C* in the interval of the viewing angle.

Here, the following steps are carried out:

defining a layer design, comprising at least a first material for highly refractive first individual layers and a second material for low refractive second individual layers, a number of desired layer packets including the individual layers, starting values of the thickness of the individual layers;

defining target colour values, comprising brightness L*, chromaticity C* and hue angle h, at least at limit values for an interval of a viewing angle having the limit values of 0° and 30°;

carrying out an optimisation method to vary the individual layer thicknesses until an optimisation target is reached.

The target colour values at the limit values of the interval can advantageously be chosen to be the same or similar.

In particular, maximum deviations for the hue angles of different residual reflection colours can be specified.

The layer system can advantageously have four or five layer packets. More than five layer packets can also be provided.

Chromaticity can also be referred to as colour saturation. The hue angle can also be referred to as the colour angle.

Advantageously, by varying the layer thicknesses of the partial layers, a colour-stable layer system can be provided, the residual reflection colour of which does not change or changes only slightly, even with a larger change in the viewing angle.

Favourably, a colour-stable residual reflection colour can be achieved through a suitable combination of chromaticity and hue angle over a large viewing angle range.

The first partial layers of the stack of layers in the stack, which are closer to the substrate, can be formed from the same first material. The second partial layers, which are further away from the substrate, can also be formed from the same second material that is different from the first material of the first partial layers.

In this case, it can be provided that a functional layer made of a third material, which has refractive properties comparable to those of the second partial layer, is arranged in the layer packet furthest from the substrate between the first and second partial layer. For computation purposes, the functional layer can optionally be assigned to the second partial layer. Alternatively, the materials of the first partial layers in the stack can vary. Likewise, it can alternatively be provided that the materials from which the second partial layers are formed vary in the stack.

Advantageously, the chromaticity at the upper limit of the viewing angle can have a value of 16 at the most and/or the maximum value of the chromaticity in the interval of the viewing angle is 16 at the most. This enables the realisation of all reflection colours with high colour constancy for a residual reflection, not only at the edge of the hue angle.

According to an advantageous embodiment of the method according to the invention, the hue angle h in the interval of the viewing angle having the limit values of 0° and 30° can change by at most 15°, preferably can change by at most 10°;

and/or the amount of the change Δh of the hue angle h in a second interval of a viewing angle from 0° to a limit viewing angle θ having upper limit values between at least 30° and at most 45° in relation to the surface normal on the layer system can be less than the amount of a change ΔC* in the chromaticity C* in the second interval of the viewing angle and the amount of the chromaticity C* at the limit viewing angle θ can be at least 2.

In particular, the hue angle h in the second interval can change by at most 20°, preferably can change by at most 15°;

and/or the photopic reflectance Rv in the interval of the viewing angle having the limit values of 0° and 30° can be at most 1.5%, preferably at most 1.2%;

and/or the scotopic reflectance Rv' in the interval of the viewing angle having the limit values of 0° and 30° can be at most 1.5%, preferably at most 1.2%.

The photopic reflectance takes into account a spectral sensitivity of the human eye for daytime vision, while the scotopic reflectance takes into account a spectral sensitivity of the human eye for night-time vision.

The colour impression of the residual reflection of the optical system remains completely or almost unchanged for an observer over a large range of the viewing angle.

A colour-stable residual reflection colour is advantageously obtained even with larger variations in the viewing angle.

The first partial layers can advantageously be formed from a high refractive material.

Favourably, the first partial layers can consist of at least one or more of the compounds $Ta_2O_5$, $TiO_2$, $ZrO_2$, $Al_2O_3$, $Nd_2O_5$, $Pr_2O_3$, $PrTiO_3$, $La_2O_3$, $Nb_2O_5$, $Y_2O_3$, $HfO_2$, InSn oxide, $Si_3N_4$, MgO, $CeO_2$, ZnS and/or their modifications, in particular, their other oxidation states and/or mixtures thereof with silanes and/or siloxanes.

These materials are known as materials with a high classic refractive index for use in optical elements, such as for the coating of spectacle lenses.

However, the higher refractive partial layers can also contain $SiO_2$ or other lower refractive materials, as long as the refractive index of the entire partial layer is greater than 1.6, preferably at least 1.7, most preferably at least 1.8, particularly preferably at least 1.9.

The second partial layers can advantageously be formed from a low refractive material.

The lower refractive partial layers can include at least one of the materials $MgF_2$, SiO, $SiO_2$, $SiO_2$ with additions of Al, silanes, siloxanes in pure form or with their fluorinated derivatives. However, the lower refractive partial layers can also contain a mixture of $SiO_2$ and $Al_2O_3$. The lower refractive partial layers can preferably contain at least 80 percent by weight $SiO_2$, most preferably, at least 90 percent by weight $SiO_2$.

The refractive index of the low refractive partial layers is preferably at most 1.55, preferably at most 1.48, most preferably at most 1.4.

This information on refractive indices relates to normal conditions at a temperature of 25° C. and a reference wavelength of the light intensity used of 550 nm.

Typical examples of layered materials with different refractive indices are silicon dioxide ($SiO_2$) with a refractive index of 1.46, aluminium oxide ($Al_2O_3$) with a refractive index of 1.7, zirconium dioxide ($ZrO_2$) with a refractive index of 2.05, praseodymium-titanium oxide ($PrTiO_3$) with a refractive index of 2.1, titanium oxide ($TiO_2$) and zinc sulphide (ZnS) each with a refractive index of 2.3. These values represent mean values that can vary by up to 10% depending on the coating method and layer thickness.

Customary optical glasses have refractive indices between 1.5 and 2.0. Layered materials with refractive indices less than 1.5, such as $MgF_2$, $SiO_2$, are therefore referred to as low refractive materials in combination with optical glasses; layered materials with refractive indices greater than 2.0, such as $ZrO_2$, $PrTiO_3$, $TiO_2$, ZnS, are referred to as high refractive materials in combination with optical glasses.

The difference in the refractive indices between the high refractive and low refractive materials of the first and second partial layers is preferably at least 0.2 to at least 0.5, depending on the coating method and layer thickness.

The materials used for this type of coating are the typical materials that are deposited on a substrate in optics using, for example, PVD methods (PVD=Physical Vapor Deposition) or CVD methods (CVD=Chemical Vapor Deposition).

According to a favourable configuration of the optical element, at least the first partial layers can be formed from the same first material and the second partial layers can be formed at least predominantly from the same second material.

Optionally, the second partial layers can be formed from the same second material and have a functional layer between the first partial layer and the second partial layer only in the layer packet furthest from the substrate. The functional layer can be low refractive and, if necessary, may be added to the second partial layer for computation purposes.

According to an advantageous embodiment of the method according to the invention, a spectral reflection measurement can be carried out on the layer system in an optical measuring system for the determining of a spectral actual measuring plot of the layer system. From the spectral reflection measurement, further suitable layer parameters can be determined in a favourable manner by simulation computations.

According to an advantageous embodiment of the method according to the invention, the computing of colour values of a residual reflection colour of the layer system from the actual measuring plot can further comprise that a brightness L*, a chromaticity C* and a hue angle h of the residual reflection colour is determined from the actual measuring plot.

According to an advantageous embodiment of the method according to the invention, the determining of an actual data set by fitting a simulation target measuring plot to the actual measuring plot in the simulation computer can further comprise (i) detecting at least one spectral measuring plot having ordinate values and abscissa values as actual measuring plot at the layer system which consists of one or more individual layers having respective facility actual layer thicknesses set at the coating facility for producing the layer system, wherein the one or more individual layers are produced according to a target data set of the at least one coating facility, wherein the target data set comprises at least the facility actual layer thicknesses of the one or more individual layers, which are assigned to the one or more individual;

(ii) assigning the actual measuring plot of the layer system according to an assignment criterion, in particular, for significant spectral points of the actual measuring plot, to a target measuring plot of a target data set having ordinate values and abscissa values, which is based on a target layer system, formed from one or more individual layers, wherein the target data set comprises at least one of the known target layer thickness of the one or more individual layers assigned to the respective individual layer;

(iii) generating a simulation actual measuring plot according to an iterative method by varying of at least simulation actual layer thicknesses of the one or more individual layers in at least one spectral interval of the actual measuring plot and receiving of a final simulation actual data set having at least final simulation actual layer thicknesses assigned to the respective individual layers, through which the actual measuring plot in the simulation actual measuring plot is at least approximated, until a stable result is achieved for the assignment criterion according to a statistical selection method, wherein the target layer thicknesses are used as start values of the simulation actual layer thicknesses;

(iv) generating a simulation target measuring plot according to an iterative method by varying at least the simulation target layer thickness of the one or more individual layers assigned to the respective individual layer in at least one spectral interval of the target measuring plot and receiving of a final simulation target data set having at least final simulation target layer thicknesses assigned to the respective individual layers, through which the target measuring plot in the simulation target measuring plot is at least approximated, until a stable result is achieved for the assignment criterion according to a statistical selection method; wherein the simulation actual layer thicknesses are used as the starting values of the simulation target layer thicknesses;

wherein the iterative method is carried out for one or more spectral intervals, wherein each subsequent interval comprises the previous interval.

The significant points of the actual measuring plot can be used advantageously to find the target design of the layer system that matches the actual measuring plot of the layer system being examined and then to use it for a first approximation in the form of a horizontal and/or lateral displacement of the measuring plot.

The target data set with the target measuring plot contains the target data for the optimal coating. In addition to a spectrally resolved optical measurement, this data can also contain other target variables, such as the colour values L*, C* and h* in the visible spectral range and/or defined, computable spectral variables, such as averaged or weighted transmission and/or reflection values, in any interval to be defined. Examples of spectrally computable variables can be the visual range as well as the IR-A/IR-B and/or UV-A/UV-B range.

Furthermore, the target data set contains coating-specific spectral intervals nested from small to large. The largest specified interval reflects the maximum spectral viewing range. The number of intervals can be freely selected. The target data set contains characteristic spectral points that clearly fix the optical layout of the coating.

The actual measuring plot comprises at least the data of the optical measurement that was carried out. The facility data set comprises at least the actual layer thicknesses of the several individual layers adjusted at the coating facility, if the layer system is formed from several individual layers, or the actual layer thickness of the one individual layer adjusted at the coating system, if the layer system is formed from only one individual layer.

The simulation actual measuring plot comprises at least one simulated spectral measuring plot, which represents the best possible match with the optical measurement carried out as the actual measuring plot.

The actual simulation data set comprises at least the actual simulation layer thickness of one of the individual layers of the layer system determined in the iterative optimisation method or the actual simulation layer thicknesses of the several individual layers of the layer system.

The simulation target measuring plot comprises at least one simulated spectral measuring plot that represents the best possible match between the target measuring plot and the simulation actual measuring plot.

The simulation target data set comprises at least the simulation target layer thicknesses of the several individual layers determined in the iterative optimisation method or the simulation target layer thickness of the one individual layer with the best possible match between the target measuring plot with offsetting over the simulation target data set. The adjusted one or more simulation target layer thicknesses of this data set represent the process parameters for the next coating batch.

For this purpose, the simulation target data set comprises the adjusted computation parameters of the simulated layer system for ideal layers and/or ideal processes, material properties, such as ideal refractive index values and ideal deposition conditions, as well as system parameters, such as coating geometry, layer thickness control, etc.

On the one hand, the simulation target data set correlates the optical differences between the actual measuring plot and the simulation actual measuring plot and takes into account system-related deviations, such as morphological and technical deviations from coating batch to coating batch, as well as non-system-related deviations, such as handling differences etc. On the other hand, the simulation actual data set is used for back-computation of the simulation target measuring plot to the target measuring plot.

The method according to the invention provides that an actual measuring plot of a layer system, which was deposited on the coating facility, is loaded into the simulation software of a simulation computer.

Based on the scaled provisional one or more layer thicknesses from the previous step, an optimisation method starts in a limited spectral interval. This limited spectral interval is specific to the coating and is stored in the target data set assigned to the target measuring plot as the first possible from an interval list of the target data set.

As part of this optimisation method, the layer thickness of one individual layer, when the layer system is formed from a single layer, or the layer thicknesses of several individual layers, when the layer system is formed from several individual layers, are determined, which describe the actual measuring plot with the underlying simulation target measuring plot in a first approximation.

After this step, a second provisional set of one or more layer thicknesses is provided. When no restriction was necessary, this second simulation actual data set is identical to the first provisional simulation actual data set.

The optimisation method is now applied for each further spectral interval from the interval list of the target data set. The currently running optimisation method always uses the set of the simulation actual data set of the previous optimisation method.

Typically, an adapted simplex algorithm can be used as the optimisation method, but other known simulation methods may also be suitable. Simulation software for such optimisation methods is commercially available from various manufacturers, for example, the commercial simulation software "Essential MacLeod" or other known simulation software, for example, for producing optical layers.

When all interval iterations have been run through, the spectral data of the actual measuring plot are approximated in good agreement and there is a first final simulation actual measuring plot and also a corresponding set of simulation actual layer thicknesses. These two sets of parameters form the simulation actual data set that is temporarily stored.

These steps are repeated until a statistical selection method produces a stable result. The entire plot can preferably be considered for this purpose, in particular, for example, with regard to chi-square deviations and the like.

According to an advantageous embodiment of the method according to the invention, the determining of computed actual layer parameters by simulation of the layer system using the actual data set can further comprise: providing the final simulation target data set for the at least one coating facility as a new facility data set for depositing a further layer system having at least one or more correction actual layer thicknesses for the determining of new facility actual layer thicknesses, which are determined from the final simulation target layer thicknesses with the final simulation target data set.

When the spectral data of the actual measuring plot are approximated in the best possible agreement, the final simulation target data set can be generated with the one or more simulation actual layer thicknesses. With the new facility data set, further layer systems can then be produced on the coating facility, which correspond better to the originally desired target data set.

According to a further, in particular, independent aspect of the invention, a coating system is proposed for producing layer systems using a method as described above, comprising at least a coating facility for coating a substrate with a layer system for an optical element; a control computer for controlling the coating facility and for communication with a simulation computer; an optical measuring device for determining a spectrally resolved actual measuring plot of the layer system; a simulation computer on which simulation software for optical computation and optimisation of the layer system is installed; a design database for storing target data sets; a filing database for storing actual measuring plots, actual data sets, computed actual layer parameters and approval decisions; a criteria database for storing of approval criteria, and a decision system for the approval of layer systems.

In this way, the coating system comprises all the necessary components that are required for effectively operating the coating system according to the method according to the invention as described above. As a result, a coating facility for producing a layer system can be operated more effectively and quickly. This results in a considerable savings potential during operation of the coating facility.

The coating facility comprises, for example, a vacuum chamber with associated aggregates for coating substrates, such as various coating sources, screens, glass holders, pumps, etc.

Advantageously, the coating system can be operated in a self-controlled and feedback mode using the method according to the first aspect of the invention.

The control computer of the coating facility controls the coating process on the coating facility and takes over the communication with the coating facility. This computer can include at least a network connection for automatic data exchange.

A spectrally resolved measurement signal, which reflects the optical element consisting of the optical substrate and the applied layer system, can be recorded in the optical measuring device. This so-called actual measuring plot can be provided as a two-dimensional data set consisting of data tuples, for example, as wavelength in nanometres, reflectivity in %. These data are referred to as "spectral data".

The simulation software is installed on the simulation computer.

The simulation software is a computer program that can at least read in the data set generated by the optical measuring device. The simulation software can also read in and output data sets from the coating facility.

The software works with input from the design database and reads out, for example, target data sets from the design database and files newly computed simulation data sets in the filing database. Furthermore, the software implements at least one arbitrary optimisation/fitting algorithm as it can be found in commercially available simulation programs, for example in "Essential MacLeod".

The simulation target data sets obtained for each coating facility and for each coating process are stored in the filing database and can be read out again at a later point in time. In addition, the database contains the relevant target data sets for all stored coating processes.

The relevant approval criteria are stored in the criteria database according to the latest regulations, searches of patent databases, definitions according to development and sales aspects and the like.

The decision system, which can be designed as a separate processor, makes decisions about releasing the layer system based on a comparison of at least the actual data set, the computed actual layer parameters and the quality requirement data and documents the decision in the filing database.

However, the decision system can also be implemented, for example, not as separate hardware, but as a process on the control computer of the coating system.

According to a further, in particular, independent aspect of the invention, a computer program product is proposed for a method for operating a coating system for producing layer systems, wherein the computer program product comprises at least one computer readable storage medium, which comprises program commands, that are executable on a computer system and cause the computer system to carry out a method, comprising (i) coating a layer system in a coating facility; (ii) determining a spectral actual measuring plot for the layer system in an optical measuring system; (iii) determining an actual data set by fitting a simulation target measuring plot to the actual measuring plot; (iv) determining actual layer parameters as computed actual layer parameters from the simulation target measuring plot by simulation of the layer system using the actual data set; (v) outputting the actual data set and the computed actual layer parameters at least to a decision system; (vi) providing quality requirement data; (vii) deciding on an approval of the layer system in the decision system on the basis of a comparison of at least the actual data set, the computed actual layer parameters and the quality requirement data.

The quality requirement data can in particular be loaded from a criteria database.

Optionally, colour values of a residual reflection colour of the layer system can also be computed from the actual measuring plot.

In addition, computed reflection plots, in particular, angle-dependent reflection plots, can be generated and used for the decision. The computed actual layer parameters can comprise reflection values in wavelength ranges outside of the actual measuring plot, in particular, in the UV wavelength range, and/or reflection values at different angles of incidence. Such a procedure is based on derived variables for the quality requirement data based on the approval criteria. In this way, parameters for an approval decision can be used that cannot be determined directly due to equipment conditions or because the measurements are too complex.

The computer program product can provide the software for operating a coating system for producing layer systems in a modular manner and can make it accessible for a wide variety of data processing systems. The computer program product can be used advantageously as a process recipe program coupled with a control program of the coating facility.

Advantageously, a coating system or a system of coating facilities can be operated in a self-controlled and feedback mode by means of the computer program product using the method according to the first aspect of the invention.

According to a further, particularly independent aspect of the invention, a data processing system is proposed for executing a data processing program, which comprises computer readable program commands to carry out a method for operating at least one a coating system for producing layer systems, in particular, as described above.

The data processing system can favourably comprise the simulation computer as well as the design database, the filing database, the criteria database, but, optionally, also the control computer of the coating facility.

Advantageously, by means of the data processing system using the method according to the first aspect of the invention, a coating system or a system of coating facilities can be operated in a self-controlled and feedback mode.

DRAWING

Further advantages result from the following description of the drawings. The figures show exemplary embodiments of the invention. The figures, the description, and the claims contain numerous features in combination. The person skilled in the art will expediently also consider the features individually and combine them into further meaningful combinations.

Figure 2:
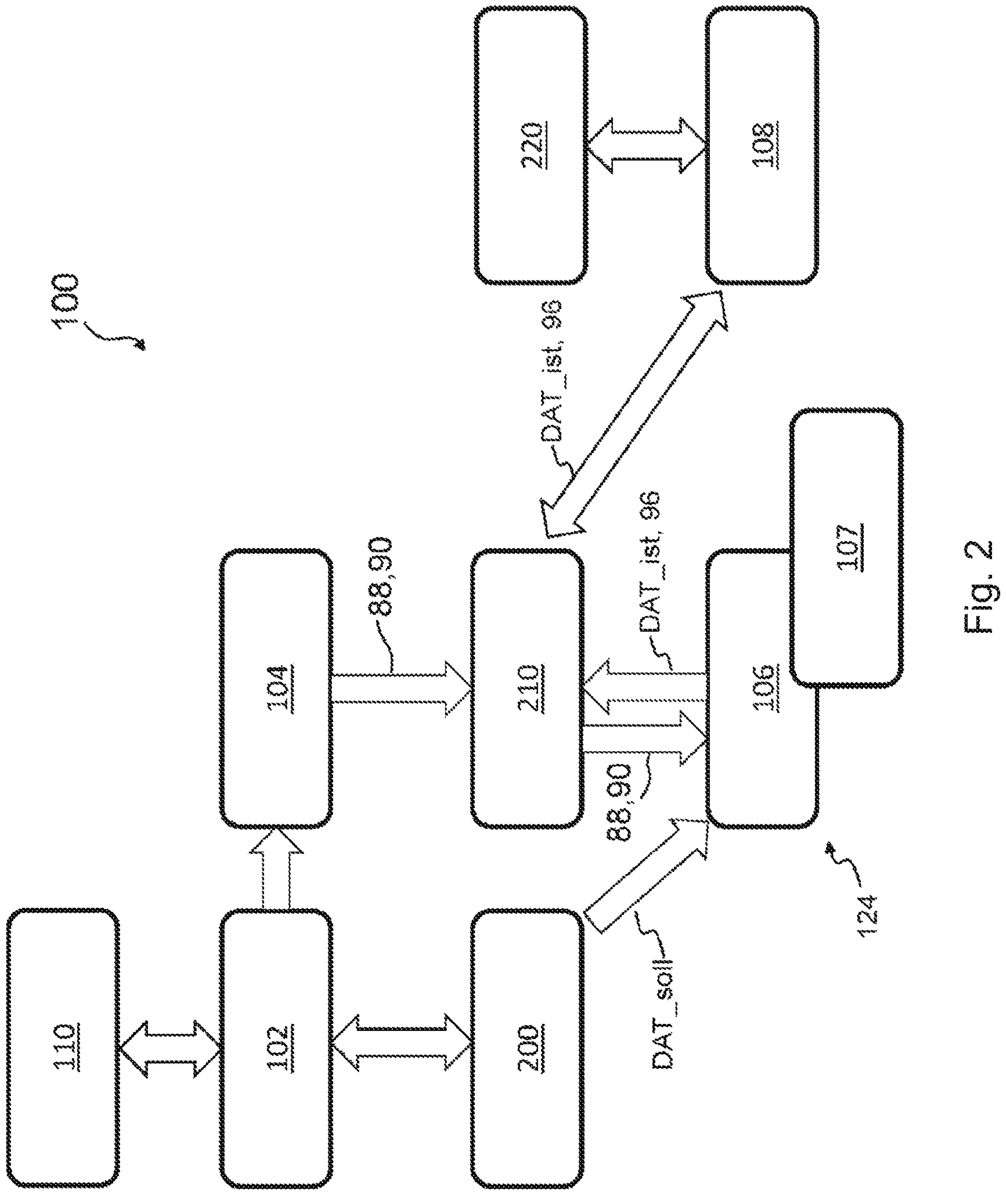
Figure 4:
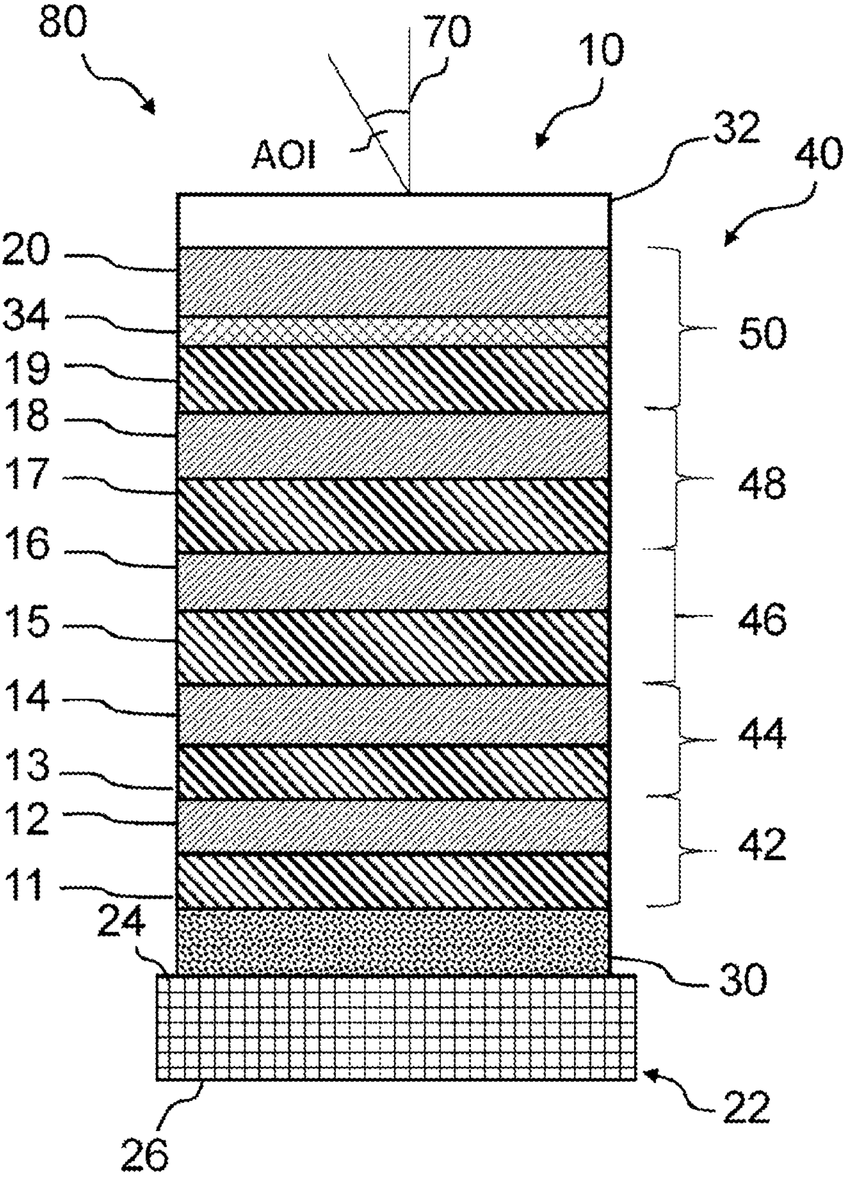
Figure 5:
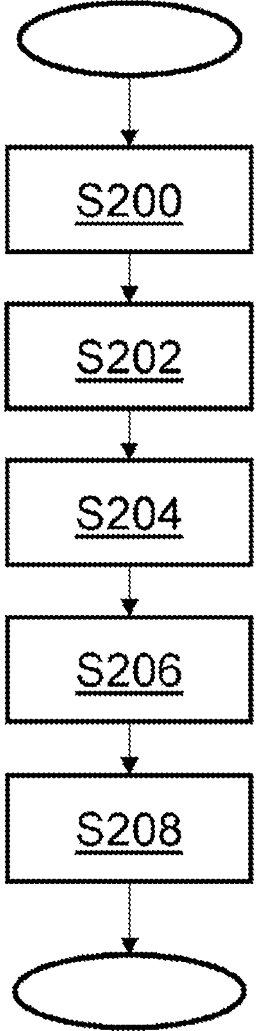
Figure 6:
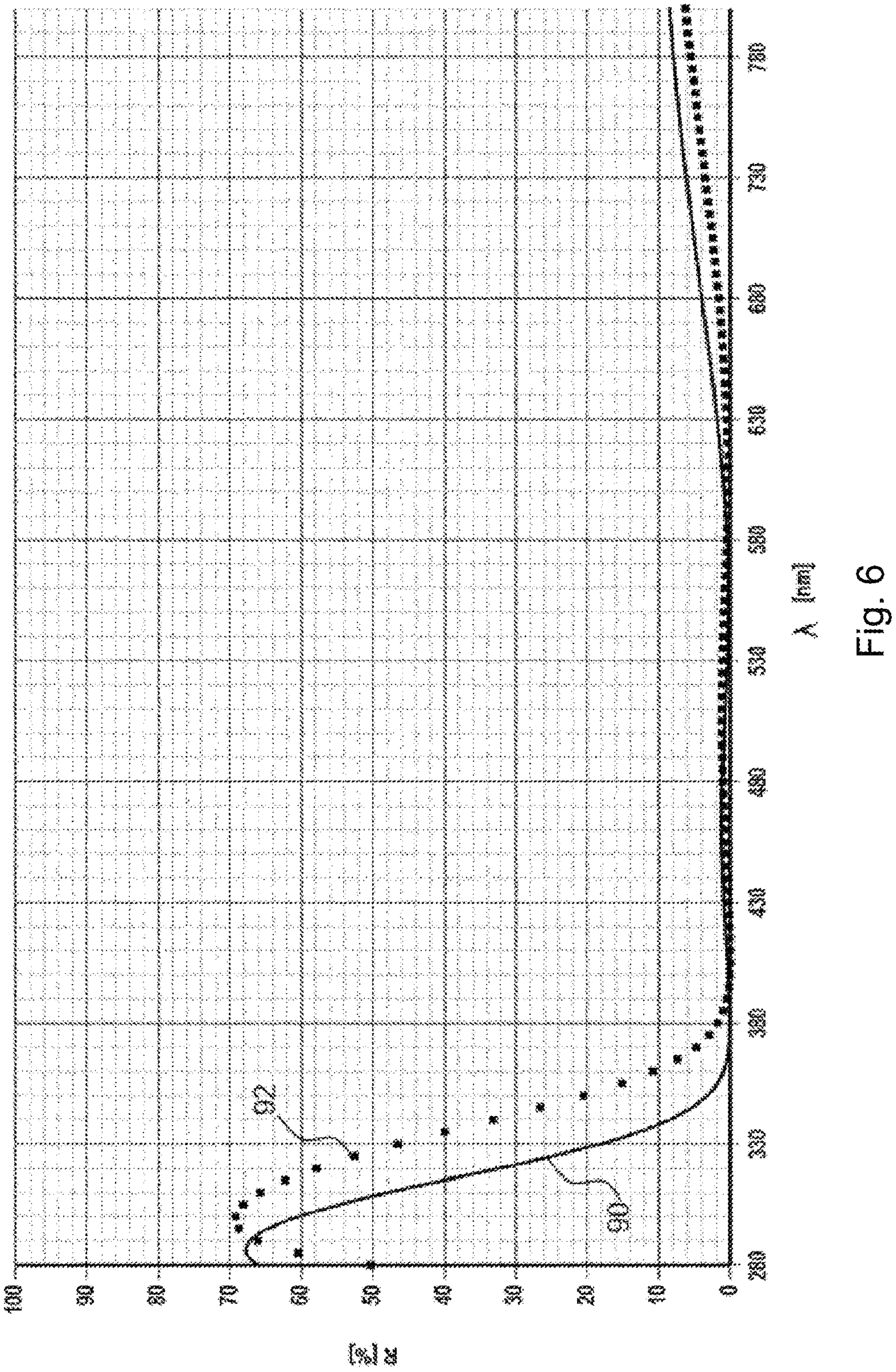
Figure 7:
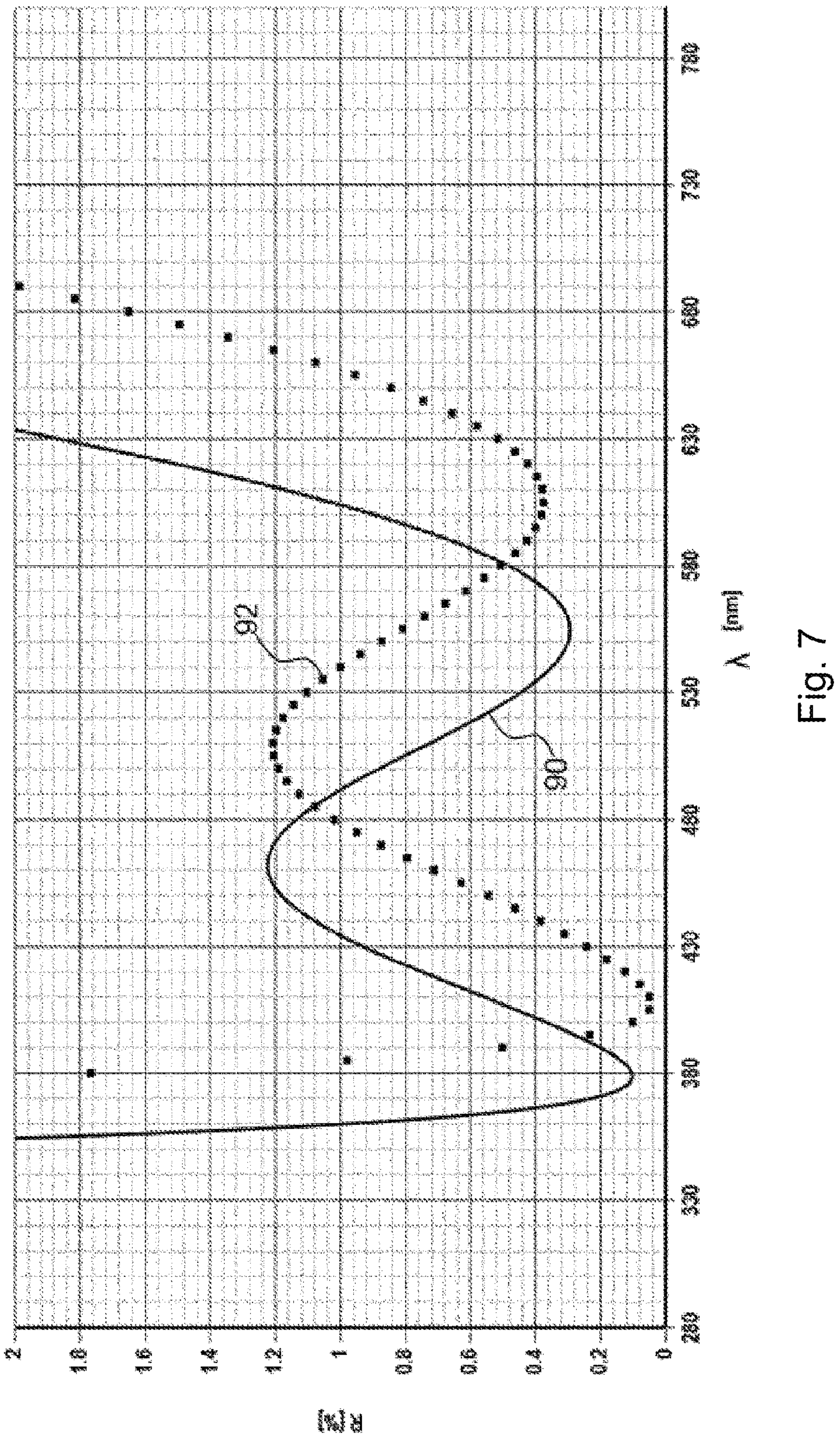
Figure 8:
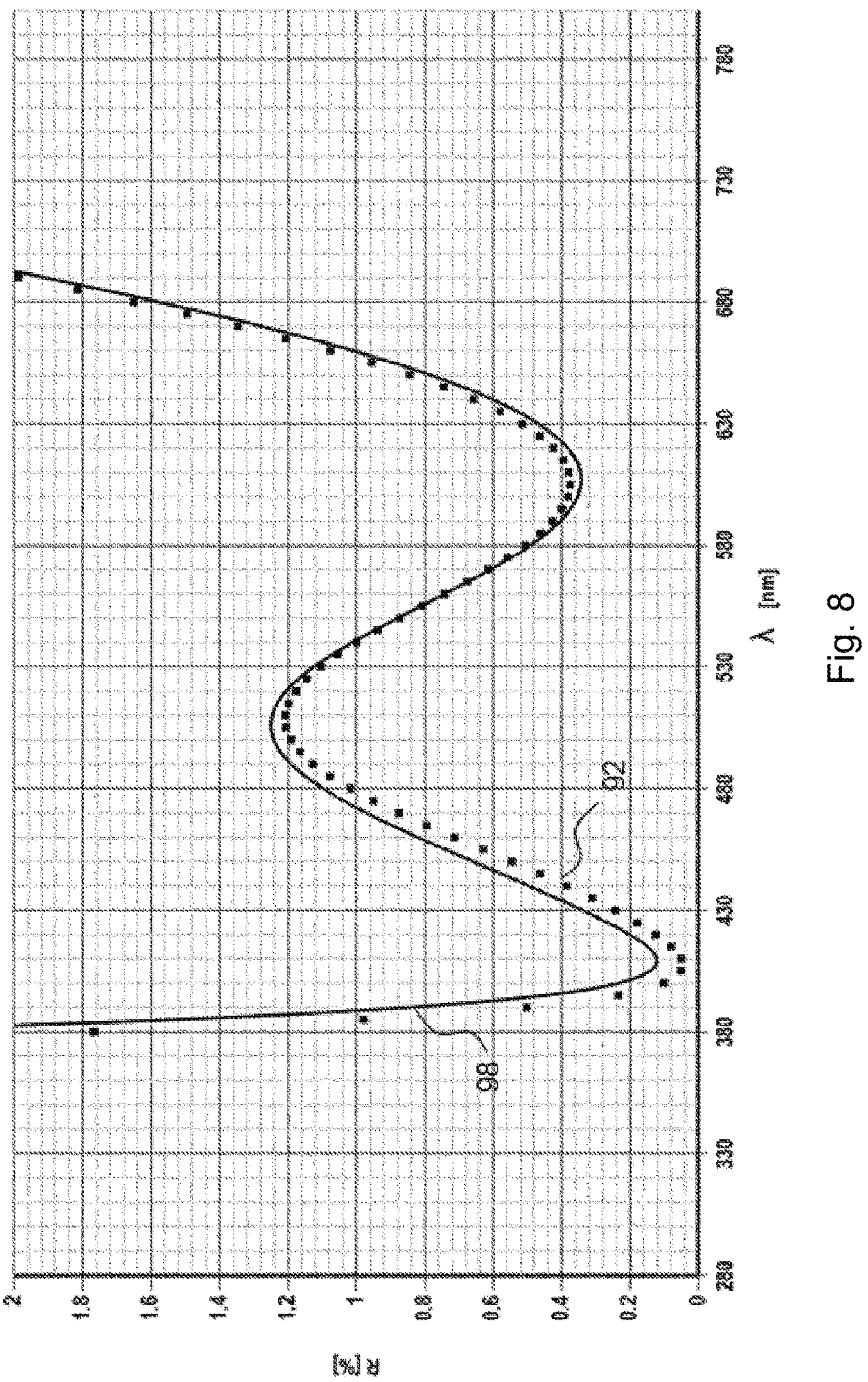
Figure 9:
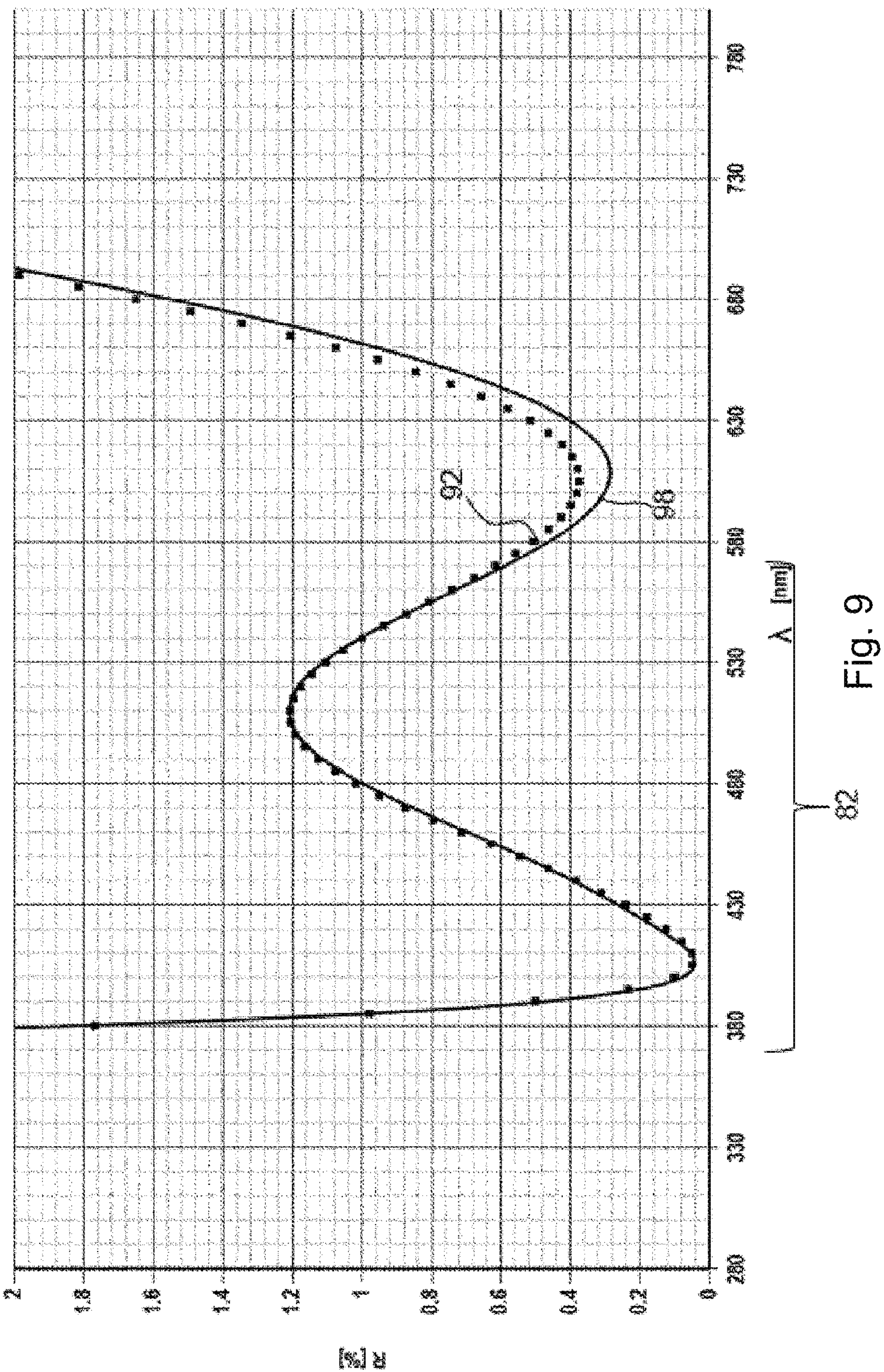
Figure 10:
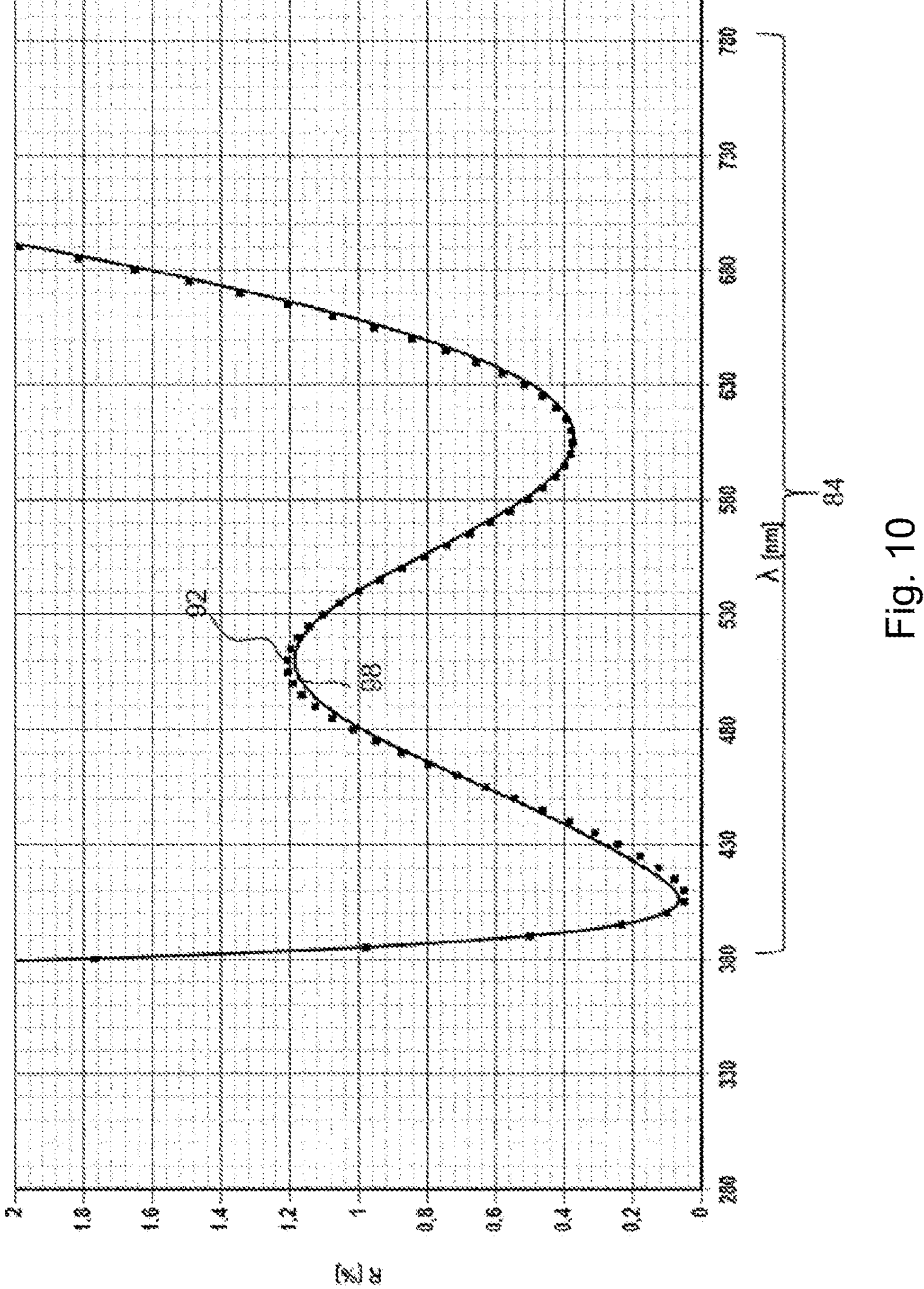
Figure 11:
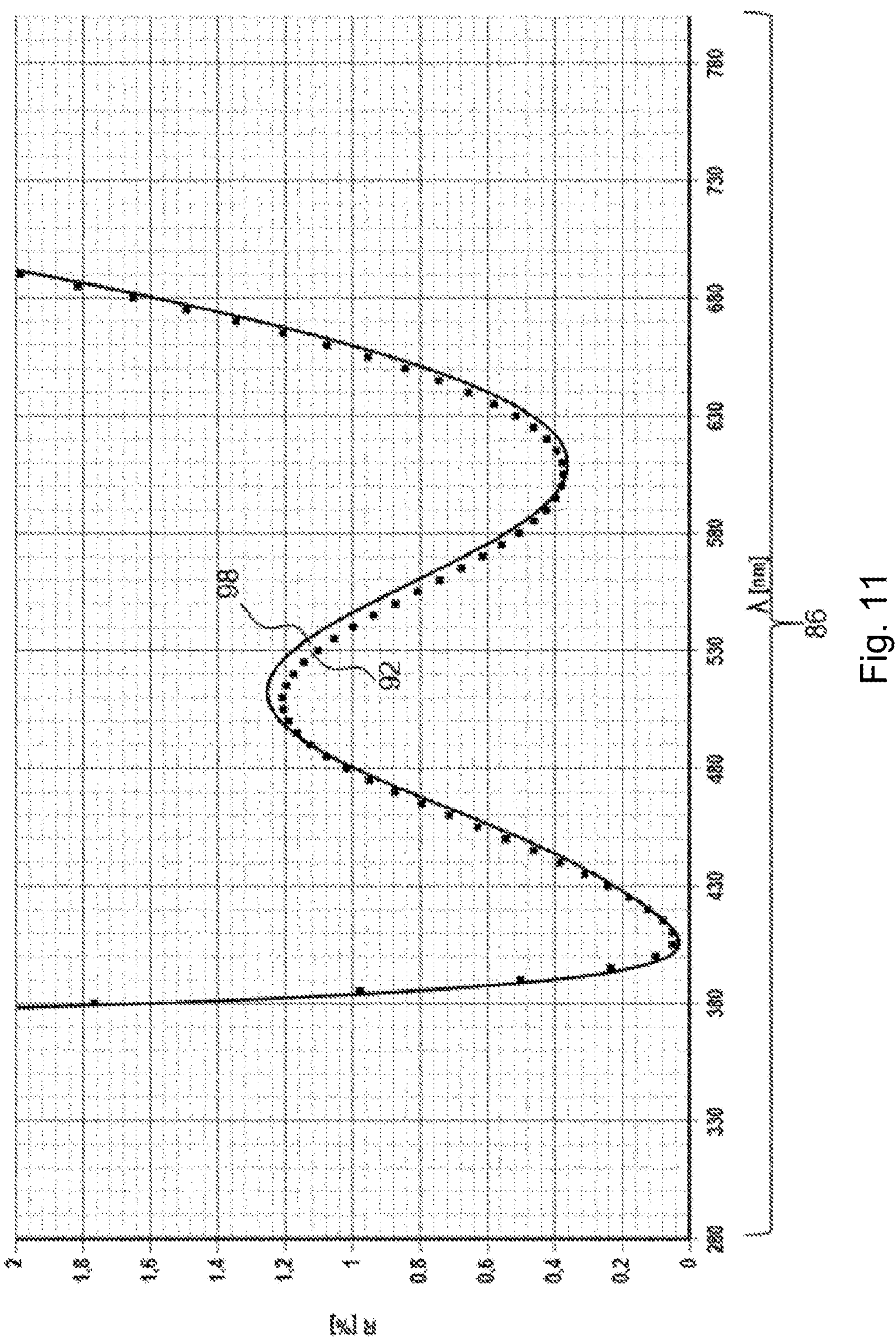

It is exemplary shown in:

FIG. 1 a sequence of the method for operating a coating system for producing layer systems for optical elements according to an exemplary embodiment of the invention;

FIG. 2 a block diagram of a coating system according to an exemplary embodiment of the invention;

FIG. 3 a table with approval criteria according to the method of the invention;

FIG. 4 an optical element with a layer system of five layer packets on a substrate according to an exemplary embodiment of the invention;

FIG. 5 a flow chart for determining an actual data set by fitting a simulation target measuring plot to the actual measuring plot according to the method of the invention;

FIG. 6 reflectivity plots of a layer system according to the invention with perpendicular incidence of light with a comparison of an actual measuring plot and a target measuring plot in the wavelength range from 280 nm to 800 nm;

FIG. 7 an enlarged representation of the reflectivity plots of FIG. 6;

FIG. 8 reflectivity plots of the layer system with perpendicular incidence of light with a comparison of the target measuring plot and a scaled simulation target measuring plot;

FIG. 9 reflectivity plots of the layer system with perpendicular incidence of light with a comparison of the target measuring plot and a simulation target measuring plot fitted in a first spectral interval of 380 nm to 580 nm;

FIG. 10 reflectivity plots of the layer system with perpendicular incidence of light with a comparison of the target measuring plot and a simulation target measuring plot fitted in a larger spectral interval of 380 nm to 780 nm; and FIG. 11 reflectivity plots of the layer system with perpendicular incidence of light with a comparison of the actual measuring plot and a simulation target measuring plot fitted over the entire wavelength range from 280 nm to 800 nm.

EMBODIMENTS OF THE INVENTION

In the figures, components of the same type or having the same effect are denoted by the same reference symbols. The figures only show examples and are not to be understood as limiting.

Directional terminology used in the following with terms such as "left", "right", "above", "below", "in front of", "behind", "after", and the like only serves to improve understanding of the figures and is in no way intended to limit the generality. The components and elements shown, their design and use can vary according to the considerations of a person skilled in the art and can be adapted to the respective applications.

FIG. 1 shows a sequence of the method for operating a coating system 100 for producing layer systems 10 for optical elements 80 according to an exemplary embodiment of the invention.

In step S100, the method comprises the coating of a layer system 10 in a coating facility 102. The system components can be seen in the block diagram of a coating system 100 illustrated in FIG. 2.

As soon as the coating is complete, a spectral actual measuring plot 90 of the layer system 10 can be determined in an optical measuring system 104 in step S102. For this purpose, a coated optical element 80 is removed from the coating facility and the spectral reflection is measured at it in order to record an actual measuring plot 90. For example, the optical element 80 is specified as a layer system 10 in FIG. 4. An exemplary actual measuring plot 90 is shown in FIGS. 6 and 7.

Optionally, colour values 88 of a residual reflection colour of the layer system 10 can be determined from the actual measuring plot 90 in step S104 and the actual measuring plot 90 and the computed colour values 88 can be filed in a filing database 210 in step S106. The colour values 88 of the residual reflection colour are computed from the data of the spectral reflection (λ, R(λ)) according to a standard. For example, a brightness L*, a chromaticity C* and a hue angle h of the residual reflection colour are determined from the actual measuring plot.

In step S108 a target data set Dat_soll of the layer system 10 from a design database 200 and the actual measuring plot 90 are then loaded into a simulation computer 106. The actual measuring plot 90 can be loaded as a target plot. In addition, the design of the completed coating is queried in the design database 200 as a target data set Dat_soll.

In step S110, an actual data set Dat_ist is determined by fitting a simulation target measuring plot 98 to the actual measuring plot 90 in the simulation computer 106. Such a simulation target measuring plot 98 is illustrated in FIGS. 8 to 10, for example. The physical individual layer thicknesses of the underlying design of the layer system 10 are varied within reasonable limits until the actual measuring plot 90 has been met in the best possible way.

In step S112, actual layer parameters 96 are determined as computed actual layer parameters 96 from the simulation target measuring plot 98 by simulating the layer system 10 with the actual data set Dat_ist. The simulation can now be used to obtain additional parameters that are not accessible from the original reflection measurement as actual measuring plot 90, such as the reflection plot at different angles of incidence, the reflection in spectral ranges outside the measuring range of the spectrometer, etc. The computed actual layer parameters 96 can thus comprise, for example, reflection values in wavelength ranges outside of the actual measuring plot 90, in particular in the UV wavelength range, and/or reflection values at different angles of incidence.

Then, in step S114, the actual data set Dat_ist, the computed actual layer parameters 96 are output to a decision system 108 and to the filing database 210. The raw data of the spectral reflection (λ, R(λ)) as well as the colour values computed therefrom are stored in the filing database 210.

In step S116 approval criteria for layer systems 10 are loaded into the decision system 108 from a criteria database 220. In step S118, the decision system 108 is provided with quality requirement data, in particular, loaded into the decision system 108 from the criteria database 220. The criteria database 220 can comprise positive or negative criteria for all coatings.

The approval criteria can comprise permissible and/or non-permissible layer parameters, in particular, from which requirements are derived, which can be used for the comparison with the actual data set Dat_ist and/or the computed actual layer parameters 96 and/or the actual measuring plot 90.

The quality requirement data can also comprise tolerance values for the target data set Dat_soll of a layer system 10.

Then, in step S120, an approval S122, S124 of the layer system 10 is decided on in the decision system 108 on the basis of a comparison of at least the actual data set Dat_ist, the computed actual layer parameters 96, and the quality requirement data, for example, S122 can mean accepted, S124 can mean rejected. The computed parameters can be compared with target values and defined tolerances. An automatic, software-based approval decision follows as to whether the coating batch corresponds to the defined quality requirement data or not.

The decision regarding approval of the layer system 10 in the decision system 108 can therefore expediently comprise an automatic, software-based approval decision. In particular, the approval can take place using an artificial intelligence method.

The decision S122, S124 is then documented in the filing database 210.

Alternatively, the decision system 108 can decide in advance, before a coating is carried out in the coating facility 102, based on a comparison of at least the target data set Dat_soll and approval criteria from the criteria database 220, whether the planned layer system 10 has a chance at all, to receive an approval based on the already existing approval criteria.

FIG. 2 shows a block diagram of a coating system 100 according to an exemplary embodiment of the invention. The coating system 100 is used for producing a layer system 10 with the method described in FIG. 1.

The coating system 100 comprises a coating facility 102 for coating a substrate 22 with a layer system 10 for an optical element 80, and further a control computer 110 for controlling the coating facility 102 and for communication with a simulation computer 106.

The coated optical element 80 can be transferred to an optical measuring device 104 to determine a spectrally resolved actual measuring plot 90 of the layer system 10.

A design database 200 is used to store target data sets Dat_soll from layer systems 10.

The coating system 100 further comprises a simulation computer 106 on which simulation software 107 for the optical computation and optimisation of the layer system 10 is installed.

A computer program product for a method according to the first aspect of the invention for operating at least one coating facility 102 for producing layer systems 10 for optical elements 80 is implemented on the simulation computer 106, wherein the computer program product comprises at least one computer readable storage medium, which comprises program commands that are executable on the computer system 106 and cause the computer system 106 to carry out the method.

The computer program product can be viewed as an independent aspect of the invention, in particular, for carrying out a method according to the first aspect of the invention on a simulation computer 106 of a data processing system 124.

The data processing system 124, which comprises at least the simulation computer 106 and the simulation software 107, is used for executing a data processing program, which comprises computer readable program commands in order to carry out the method for operating the coating facility 102 for producing layer systems 10 for optical elements 80.

The data processing system 124 can be viewed as an independent aspect of the invention, in particular, for carrying out a method according to the first aspect of the invention using a simulation computer 106.

A filing database 202 is used to store actual measuring plots 90, actual data sets Dat_ist, computed actual layer parameters 96 and approval decisions.

Finally, in the coating system 100 there is a criteria database 220 for storing approval criteria, which can be loaded by the decision system 108 for the approval of layer systems 10. The decision system 108 decides whether to approve the produced layer system 10 on the basis of these approval criteria or not. Both approval criteria and quality requirement data can be filed in the criteria database 220.

FIG. 3 shows a table with approval criteria according to the method of the invention. The individual approval criteria are numbered consecutively in the table, for example 1.1, 1.2, 1.3, 1.4. For each criterion, a long text T1-T4 is listed to explain the criterion, and a numerically verifiable form N1 to N4 as well as the requirement R1 to R4 to which the criterion refers.

For example, the criteria can comprise individual claim features of a patent specification of an optical application, which are listed in the example below. The individual features in a form that can be checked numerically can be checked automatically using simple comparison algorithms.

| Claim feature | Feature (full text) | Feature (verifiable form) | Requirement |
|---|---|---|---|
| 1.1 | Ophthalmic lens with multilayer system . . . | At least one low reflecting layer At least one highly reflecting layer | Layer design |
| 1.2 | Mean reflection factor <1.15% | $R_m$ <1.15% | Spectral reflection plot |
| 1.3 | Light reflection factor <1% | $R_v$ <1.0% | Spectral reflection plot |
| 1.4 | Coating at least 3 layers | No individual layer of indium tin oxide (ITO) | Layer design |

FIG. 4 shows an example of an optical element 80 with a layer system 10 on a substrate 22, for example a spectacle lens, according to an exemplary embodiment of the invention. The interferometric layer system 10 is arranged on at least one surface 24 of the substrate 22. The layer system 10 can advantageously be produced with a self-controlling and feedback method according to the first aspect of the invention.

As the lowest layer on the substrate 22, the layer system 10 can have a single layer or multilayer intermediate layer 30 in the usual way, for example, to improve the adhesion of the stack 40 and/or as scratch protection for the substrate 22. This intermediate layer 30 can in the usual way consist, for example, of sub-stoichiometric low refractive metal oxides, chromium, silanes, or siloxanes. The intermediate layer 30 is not relevant for the further considerations of the optical properties. Intermediate layers, for example, a conventional paint system, such as primer paints and the like, can also be provided as adhesion promoters between the substrate and the layer system.

In FIG. 5, for example, five layers packets 42, 44, 46, 48, 50 of a stack 40 are arranged one after the other on the intermediate layer 30.

A stack 40 of at least four, in this example five, successive layer packets 42, 44, 46, 48, 50 is arranged on the intermediate layer 30, wherein each layer packet 42, 44, 46, 48, 50 has a pair of first individual layers 11, 13, 15, 17, 19 and second individual layers 12, 14, 16, 18, 20.

The layer packet 42 closest to the substrate comprises the individual layer 11 closer to the substrate and the individual layer 12 further away from the substrate, the next layer packet 44 comprises the individual layer 13 closer to the substrate and the individual layer 14 further away from the substrate, the subsequent layer packet 46 comprises the individual layer 15 closer to the substrate and the individual layer 16 further away from the substrate, the following layer packet 48 comprises the individual layer 17 closer to the substrate and the individual layer 18 further away from the substrate and the layer packet furthest from the substrate 50 comprises the individual layer 19 closer to the substrate and the individual layer 20 further away from the substrate.

The layer packet 50 furthest from the substrate can optionally have a functional layer 34 between the partial layer 19 closer to the substrate and the partial layer 20 further away from the substrate, which can act, for example, to increase the electrical conductivity, to equalise mechanical stress and/or as a diffusion barrier. This functional layer 34 can be formed from a low refractive material and can also be alloyed with other metal oxides, such as aluminium. For computation purposes and simulation purposes of the optical properties, the functional layer 34 can be added to the lower refractive partial layer 20 of the uppermost layer packet 50 furthest from the substrate or can possibly be disregarded, for example, in the case of a relatively small layer thickness.

In each layer packet 42, 44, 46, 48, 50, the corresponding first individual layers 11, 13, 15, 17, 19 each have a first optical thickness t1 and the corresponding second individual layers 12, 14, 16, 18, 20 each have a second optical thickness t2, which is different from the first optical thickness t1 in the respective layer packet 42, 44, 46, 48, 50.

A refractive index n1 of the respective first individual layers 11, 13, 15, 17, 19, which are closer to the substrate, is greater than a refractive index n2 of the respective second individual layers 12, 14, 16, 18, 20 of the stack 40, which are further away from the substrate. The layer system 10 has a brightness L*, a chromaticity C*, and a hue angle h of a residual reflection colour, wherein the amount of a change Δh of the hue angle h of the residual reflection colour in an interval of a viewing angle AOI with the limit values of 0° and 30° in relation to a surface normal 70 to the layer system 10 is smaller than the amount of a change ΔC* of the chromaticity C* in the interval of the viewing angle AOI.

The layer system is viewed by an observer at a viewing angle AOI of 0° up to a critical angle, such as 30°, measured from the surface normal 70.

In order to design the layer system 10, the following steps are advantageously carried out:

- defining a layer design, comprising at least a first material for highly refractive first individual layers 11, 13, 15, 17, 19 and a second material for low refractive second individual layers 12, 14, 16, 18, 20, a number of desired layer packets 42, 44, 46, 48, 50 including the individual layers 11, 12, 13, 14, 15, 16, 17, 18, 19, 20, starting values of the thickness of the individual layers 11, 12, 13, 14, 15, 16, 17, 18, 19, 20;
- defining target colour values, comprising brightness L*, chromaticity C* and hue angle h, at least at limit values for an interval of a viewing angle AOI having the limit values of 0° and 30°;
- carrying out an optimisation method to vary the individual layer thicknesses d_ist_11, . . . , d_ist_20 until an optimisation target is reached.

The substrate 22 is a plastic material, for example, in particular a transparent plastic material for a spectacle lens.

In the context of the present disclosure, the term spectacle lens refers in particular to a coated spectacle lens in accordance with Section 8.1.13 of the standard DIN EN ISO 13666:2013-10, therefore, to a spectacle lens to which one or more surface coatings have been applied, in particular, to change one or more of its properties.

Preferably, such spectacle lenses can be used particularly advantageously as spectacles (with and without correction), sunglasses, ski goggles, work goggles, as well as spectacles in connection with head-mounted display devices (so-called "head-mounted displays").

In the context of the present disclosure, the term spectacle lens can further comprise semi-finished spectacle lens products, in particular a spectacle lens blank or a spectacle lens semi-finished product according to Section 8.4.2 of the standard DIN EN ISO 13666:2013-10, therefore, a lens blank or blank with only one optically finished surface.

Based on the configurations in FIG. 4, the opposite surface 26 of the substrate 22 can optionally have a further, similar or identical layer system 10, no coating or only a protective coating (not illustrated).

Each of the individual layers 11, 13, 15, 17, 19 closer to the substrate is preferably formed from an identical first material. The first material is preferably a higher refractive material with a first refractive index n1.

Each of the individual layers 12, 14, 16, 18, 20 further away from the substrate is preferably formed from an identical second material. The second material is preferably a low refractive material with a second refractive index n2. The refractive index n1 is greater than the refractive index n2; the difference in the refractive indices n1, n2 is preferably at least 0.2, preferably up to at least 0.5.

The order of the first individual layers 11, 13, 15, 17, 19 and second individual layers 12, 14, 16, 187, 20 remains the same in the stack 40, so that in each layer packet 42, 44, 46, 48, 50 the respective first Individual layer 11, 13, 15, 17, 19 closer to the substrate is always the higher refractive one and the respective second individual layer 12, 14, 16, 18, 20 further away from the substrate is always the low refractive one of the individual layers 11, 12, 13, 14, 15, 16, 17, 18, 19, 20.

In particular, the higher refractive individual layers 11, 13, 15, 17, 19 can be layers of high refractive materials and the lower refractive individual layers 12, 14, 16, 18, 20 can be layers of low refractive materials.

The layer packets 42, 44, 46, 48, 50 in the stack 40 differ only in their respective thickness and/or in the thicknesses of the individual layers 11, 12, 13, 14, 15, 16, 17, 18, 19, 20 in the respective layer packet 42, 44, 46, 48, 50.

The stack 40 is closed off in a manner known per se with a cover layer 32, which serves, for example, to care for the layer system 10. The cover layer 32 is applied to the last optically relevant individual layer 20 of the uppermost layer packet 50 of the stack 40 and can contain fluorine containing molecules, for example. The cover layer 32 usually gives the stack 40 improved care properties, including properties such as a water-repellent and oil-repellent function, wherein a surface energy is typically less than 15 mN/m.

The cover layer 32 is no longer relevant for the further considerations of the optical properties of the layer system 10.

The optical properties of the stack 40 of the layer system 10 can be simulated by computation using known computation methods and/or optimisation methods. The layer system 10 is then produced with the specific layer thicknesses of the individual partial layers 60, 62 of the layer packets 42, 44, 46, 48, 50.

During the production of optical layer systems 10, the optical properties of the layer system 10 are adjusted during the production of the partial layers 60, 62. For example, the method known from WO 2016/110339 A1 can be used, which is briefly outlined below. With the known method, various optical effects, such as mirroring or reflection reduction, can be achieved in a material system by only changing the layer thicknesses while the material used remains the same. However, using other methods is also possible.

Different reflectivity can be achieved, in particular for a reflection reducing effect, by varying the layer packet thicknesses while keeping the same materials, as described in WO 2016/110339 A1. This is achieved by minimising or optimising a parameter σ. The parameter σ is in turn a function of the layer thicknesses of the individual layers 11, 12, 13, 14, 15, 16, 17, 18, 19, 20, or of ratios of the optical thicknesses t1, t2 of the individual layers 11, 12, 13, 14, 15, 16, 17, 18, 19, 20 of each of the four stacks of layers 42, 44, 46, 48 (not shown) or five stacks of layers 42, 44, 46, 48, 50 according to FIG. 5 in the stack 40.

At a certain wavelength λ, the optical thickness t of a layer, also called FWOT (full wave optical thickness), is determined by $$t = \frac{d}{\lambda} \cdot n$$

where d is the layer thickness, λ is the design wavelength, and n is the refractive index of the individual layers 11, 12, 13, 14, 15, 16, 17, 18, 19, 20.

A reflection reducing effect by the stack 40 can be achieved for a predeterminable reflectivity $R_m$ of the stack 40, if the product of the reflectivity $R_m$ and the parameter σ is adjusted to be less than 1:

$$R_m \cdot \sigma < 1$$

The reflectivity $R_m$, also known as the reflectance, describes here the ratio of the reflected to the incident intensity of a light beam as an energy variable. The reflectivity $R_m$ is expediently averaged over the range of light from 380 nm to 800 nm and related to 100%.

Such a condition $R_m \cdot \sigma < 1$ can be set as a boundary condition for an optimisation process of the method for producing the layer system 10.

The optical thicknesses t1, t2 of the first and second individual layers 11, 12, 13, 14, 15, 16, 17, 18, 19, 20 of the layer packets 42, 44, 46, 48, 50 are determined in that the parameter a is determined by means of an optimisation method, preferably by means of variation computation.

The thicknesses of the respective individual layers 11, 12, 13, 14, 15, 16, 17, 18, 19, 20 in the case of five layer packets 42, 44, 46, 48, 50 in the stack 40 are preferably formed dependent on a quotient $V_i$ (with i=1, 2, 3, 4, 5) of the first optical thickness t1 of the higher refractive first individual layers 11, 13, 15, 17, 19 and the second optical thickness t2 of the lower refractive second individual layers 12, 14, 16, 18, 20 of the respective stack of layers 42, 44, 46, 48, 50.

In an advantageous embodiment, in a layer system 10 according to FIG. 4, the parameter a for a stack 40 with five successive layer packets 42, 44, 46, 48, 50 can be determined from the relationship $$\sigma = \frac{v_1}{\sum_{i=2}^{nmax} v_i}$$

where, i=runs from 2 to nmax=5.

The indices i=1, 2, 3, 4, 5 stand for the sequence of the layer packets 42, 44, 46, 48, 50 on the substrate 22. Accordingly, $v_1$ stands for the layer packet 42 closest to the substrate and $v_5$ stands for the layer packet 50 furthest away from the substrate. It is known to specify perceptual colours in the so-called CIE-L*a*b* colour space (simplified CIELab colour space) in Cartesian coordinates, as is set out in DIN EN ISO 11664-4:2012-06 (EN ISO 11664-4:2011).

L* is the CIELab brightness, a*, b* are the CIELab coordinates, C* is the CIELab chromaticity and $h_{ab}$ is the CIELab hue angle.

The L* axis describes the brightness (luminance) of the colour with values from 0 to 100. The L* axis is at the zero-point perpendicular to the a*b* plane. It can also be referred to as the neutral grey axis, since all achromatic colours (shades of grey) are contained between the end points black (L*=0) and white (L*=100).

Green and red face each other on the a* axis, while the b* axis runs between blue and yellow. Complementary colour tones are opposite each other by 180° in their middle, i.e., the coordinate origin a*=0, b*=0, is grey.

The a* axis describes the green component or red component of a colour, with negative values representing green and positive values representing red. The b* axis describes the blue component or yellow component of a colour, with negative values representing blue and positive values representing yellow.

The a* values range from approx. −170 to +100, the b* values from −100 to +150, wherein the maximum values are only achieved with certain colour tones of medium brightness. The CIELab colour body has its greatest extent in the medium brightness range, but this varies in height and size depending on the colour range.

The CIELab hue angle $h_{ab}$ must be between 0° and 90° when both a* and b* are positive, between 90° and 180° when b* is positive and a* is negative, between 180° and 270° when both a* and b* are negative and between 270° and 360° when b* is negative and a* is positive.

In the case of the CIE-L*C*h colour space (simplified CIELCh colour space), the Cartesian coordinates of the CIELab colour space are transformed into polar coordinates. The cylinder coordinates C* (chromaticity, relative colour saturation, distance from the L axis in the centre) and h (hue angle, angle of the hue in the CIELab colour circle) are specified. The CIELab brightness L* remains unchanged.

The hue angle h results from the a* and b* axes $$h = \arctan\left(\frac{b^*}{a^*}\right)$$

Here, the hue angle h stands for the colour of the residual reflection of the interferometric layer system 10.

The chromaticity C* results in $$c' = \sqrt{(a')^2 + (b')^2}$$

The chromaticity C* is also referred to as the colour depth.

In order to define the layer thicknesses d_soll_11, . . . , d_soll_20 of the individual layers 11, 12, 13, 14, 15, 16, 17, 18, 19, 20, an optimisation method for varying the individual layer thicknesses d_soll_11, . . . , d_soll_20 is carried out until an optimisation goal is reached. The optimisation process then varies the individual layer thicknesses d_soll_11, . . . , d_soll_20 until the optimisation goal (colour stability) is reached.

In the interval of the viewing angle AOI with the limit values of 0° and 30°, the hue angle h can change by at most 15°, preferably by at most 10°. The amount of the change Δh of the hue angle h in a second interval of a viewing angle AOI from 0° to a limit viewing angle θ having upper limit values between at least 30° and at most 45° in relation to the surface normal 70 on the layer system 10 is less than the amount of a change ΔC* in the chromaticity C* in the second interval of the viewing angle AOI and the amount of the chromaticity C* at the limit viewing angle θ is at least 2, in particular, wherein the hue angle h in the second interval changes by at most 20°, preferably changes by at most 15°.

The photopic reflectance Rv in the interval of the viewing angle AOI having the limit values of 0° and 30° can advantageously be at most 1.5%, preferably at most 1.2%.

The scotopic reflectance Rv' in the interval of the viewing angle AOI having the limit values of 0° and 30° can advantageously be at most 1.5%, preferably at most 1.2%.

FIG. 5 shows a flow chart for determining an actual data set Dat_ist by fitting a simulation target measuring plot 98 to the actual measuring plot 90 according to the method of the invention.

The method is carried out in the simulation computer 106 and comprises, in step S200, detecting at least one spectral measuring plot having ordinate values and abscissa values as actual measuring plot 90 at the layer system 10, which consists of one or more individual layers 11, 12, 13, 14, 15, 16, 17, 18, 19, 20 having respective facility actual layer thicknesses d_ist_11, . . . , d_ist_20. The one or more individual layers 11, 12, 13, 14, 15, 16, 17, 18, 19, 20 are produced according to a target data set Dat_soll of the coating facility 102. The target data set Dat_soll comprises at least the facility actual layer thicknesses d_ist_11, . . . , d_ist_20 of the one or more individual layers 11, 12, 13, 14, 15, 16, 17, 18, 19, 20, which are assigned to the one or more individual layers 11, 12, 13, 14, 15, 16, 17, 18, 19, 20.

In step S202, the actual measuring plot 90 of the layer system 10 is assigned according to an assignment criterion, in particular, for significant spectral points of the actual measuring plot 90, to a target measuring plot 92 of a target data set DAT_soll having ordinate values and abscissa values, which is based on a target layer system 10_soll, formed from one or more individual layers 11, 12, 13, 14, 15, 16, 17, 18, 19, 20. The target data set DAT_soll comprises at least one of the known target layer thickness d_soll_11, . . . , d_soll_20 of the one or more individual layers 11, 12, 13, 14, 15, 16, 17, 18, 19, 20 assigned to the respective individual layer 11, 12, 13, 14, 15, 16, 17, 18, 19, 20.

In step S204, a simulation actual measuring plot 94 is generated according to an iterative method by varying of at least simulation actual layer thicknesses g_ist_11, . . . , g_ist_20 of the one or more individual layers 11, 12, 13, 14, 15, 16, 17, 18, 19, 20 in at least one spectral interval 82 of the actual measuring plot 90 and receiving of a final simulation actual Data set DAT_ist_sim having at least final simulation actual layer thicknesses g_ist_11, . . . , g_ist_20 assigned to the respective individual layers 11, 12, 13, 14, 15, 16, 17, 18, 19, 20, through which the actual measuring plot 90 in the simulation actual measuring plot 94 is at least approximated. This is carried out until a stable result is achieved for the assignment criterion according to a statistical selection method. The target layer thicknesses d_soll_11, . . . , d_soll_20 are used as start values of the simulation actual layer thicknesses g_ist_11, . . . , g_ist_20.

In step S206, a simulation target measuring plot 98 is generated according to an iterative method by varying at least the simulation target layer thickness g_soll_11, . . . , g_soll_20 of the one or more individual layers 11, 12, 13, 14, 15, 16, 17, 18, 19, 20 assigned to the respective individual layer 11, 12, 13, 14, 15, 16, 17, 18, 19, 20 in at least one spectral interval 82 of the target measuring plot 92 and receiving of a final simulation target data set DAT_soll_sim having at least final simulation target layer thicknesses g_soll_11, . . . , g_soll_20 assigned to the respective individual layers 11, 12, 13, 14, 15, 16, 17, 18, 19, 20, through which the target measuring plot 92 in the simulation target measuring plot 98 is at least approximated. This is carried out until a stable result is achieved for the assignment criterion according to a statistical selection method. The simulation actual layer thicknesses g_ist_11, . . . , g_ist_20 are used as starting values of the simulation target layer thicknesses g_soll_11, . . . , g_soll_20.

This iterative method is carried out for one or more spectral intervals 82, 84, 86, wherein each subsequent interval 84, 86 includes the previous interval 82, 84.

The determining of computed actual layer parameters 96 by simulation of the layer system 10 using the actual data set Dat_ist can further expediently comprise providing the final simulation target data set DAT_soll_sim for the at least one coating facility 102 as a new facility data set Dat_ist+1 for depositing in step S208 a further layer system 10_n+1 having at least one or more correction actual layer thicknesses d_korr_11, . . . , d_korr_20 as new facility actual layer thicknesses d_ist_11, . . . , d_ist_20, which are determined from the final simulation target layer thicknesses g_soll_11, . . . , g_soll_20 with the final simulation target data set DAT_soll_sim.

FIG. 6 shows reflectivity plots of a layer system 10 according to the invention with a comparison of an actual measuring plot 90 (solid line) and a target measuring plot 92 (dotted line) in the wavelength range from 280 nm to 800 nm; FIG. 7 shows an enlarged representation of the reflectivity plots from FIG. 6. The target measuring plot 92 was determined from the database 106 as the target measuring plot 92 to the actual measuring plot 90 by means of an extreme value comparison. A strong peak displacement can be seen in the lower wavelength range between 280 nm and 380 nm and in the enlarged representation in FIG. 7 in the wavelength range of 380 nm and 680 nm.

FIG. 8 shows reflectivity plots of the layer system 10 with a comparison of the target measuring plot 92 (dotted line) and a scaled simulation target measuring plot 98 (solid line). A horizontal displacement of the simulation target measuring plot 98 thus took place. The complete layer system 10 was scaled in the process, i.e., the vector containing all physical layer thicknesses g_soll_11, . . . , g_soll_20 of the individual layers 11, 12, 13, 14, 15, 16, 17, 18, 19, 20 obtained, was multiplied by a scaling factor 122, i.e., each individual layer 11, 12, 13, 14, 15, 16, 17, 18, 19, 20 was made thicker or thinner by the same scaling factor 122.

FIG. 9 shows reflectivity plots of the layer system 10 with a comparison of the target measuring plot 92 and a simulation target measuring plot 98 fitted in a first spectral interval 82 of 380 nm to 580 nm. The simplex algorithm was used as the iterative optimisation method. The algorithm was started with the optimisation goal of mapping the simulation target measuring plot 98 from the previous step as precisely as possible to the target measuring plot 92 in the interval of 380 nm to 580 nm by changing the physical layer thicknesses g_soll_11, . . . , g_soll_20. The result is a very good approximation of the two measuring plots 92, 98 in the selected interval 82.

FIG. 10 shows reflectivity plots of the layer system 10 with a comparison of the target measuring plot 92 and a simulation target measuring plot 98 fitted in a larger spectral interval 84 of 380 nm to 780 nm. This time simplex optimisation was applied in the larger interval 84 from 380 nm to 780 nm. No layer thickness relations were taken into account. In the lower wavelength range around 400 nm, the quality of the match between the two measuring plots 92, 98 is slightly poorer, while it is better in the upper wavelength range from 580 nm to 680 nm.

FIG. 11 shows reflectivity plots of the layer system 10 with a comparison of target measuring plot 92 and a simulation target measuring plot 98 fitted over the entire wavelength range as interval 86 from 280 nm to 800 nm. This time simplex optimisation was applied in the larger interval 86 from 280 nm to 800 nm. No layer thickness relations were taken into account. The quality of the match between the two measuring plots 92, 98 has deteriorated slightly in the middle wavelength range from 480 nm to 580 nm but is better on average in the entire wavelength range from 280 nm to 800 nm.

The invention claimed is:

1. A method for operating a coating system in a self-controlled and feedback mode for producing layer systems, comprising:

(i) coating a substrate with a layer system that includes a plurality of layers in a coating facility to obtain a finished spectacle lens, wherein the substrate is a transparent plastic material for a spectacle lens;

(ii) determining a spectral actual measuring plot for the layer system of the finished spectacle lens in an optical measuring system;

(iii) loading a target data set with a design of the completed coating of the layer system from a design database and the actual measuring plot into a simulation computer;

(iv) determining an actual data set by fitting a simulation target measuring plot to the actual measuring plot in the simulation computer by varying physical individual layer thicknesses of the target data set until the actual measuring plot has been met;

(v) determining actual layer parameters as computed actual layer parameters from the simulation target measuring plot by simulation of the layer system using the actual data set in the simulation computer, wherein the determined actual layer parameters include reflection values in wavelength ranges or at angles of incidence outside of the values obtained from the actual measuring plot;

(vi) outputting the actual data set and the computed actual layer parameters at least to a decision system in the form of a processor or as a process on a control computer of the coating system and to a filing database;

(vii) after the actual data set and the computed actual layer parameters are obtained from the simulation computer and output to the decision system, loading approval criteria and quality requirement data into the decision system, wherein the approval criteria and quality requirement data are from a criteria database, the approval criteria comprises permissible and/or nonpermissible layer parameters, from which the quality requirement data are derived, and the quality requirement data comprise tolerance values for the target data set; and comparing the actual data set, the computed actual layer parameters, and the quality requirement data; and (viii) deciding on an approval of the layer system of the finished spectacle lens in the decision system on the basis of a comparison of at least the actual data set, the computed actual layer parameters, and the quality requirement data.

2. The method according to claim 1, wherein the deciding on an approval of the layer system in the decision system comprises an automatic, software-based approval decision, in particular, by using an artificial intelligence method.

3. The method according to claim 1, wherein the computed actual layer parameters comprise reflection values in wavelength ranges outside of the actual measuring plot, and/or reflection values at different angles of incidence.

4. The method according to claim 1, wherein a spectral reflection measurement is carried out at the layer system in an optical measuring system for the determining of a spectral actual measuring plot of the layer system.

5. A coating system for producing layer systems in a self-controlled and feedback mode, comprising at least:

a coating facility for coating a substrate with a layer system for an optical element a control computer for controlling the coating facility and for communication with a simulation computer, the control computer being configured to perform the method according to claim 1;

an optical measuring device for determining a spectrally resolved actual measuring plot of the layer system a simulation computer on which simulation software for optical computation and optimisation of the layer system is installed;

a design database for storing target data sets;

a filing database for storing actual measuring plots, actual data sets, computed actual layer parameters and approval decisions;

a criteria database for storing of approval criteria; and a decision system for the approval of layer systems.

6. A data processing system for executing a data processing program, which comprises computer readable program commands to carry out a method for operating at least one a coating system for producing layer systems according to claim 1.

7. The method according to claim 1, wherein the step (viii) comprises the substeps of a) the decision system applying pre-defined test routines or algorithms to evaluate results of the comparison of at least the actual data set, the computed actual layer parameters, and the quality requirement data, and b) the decision system automatically determining whether the layer system is approved or not and generating an approval decision.

8. The method according to claim 1, wherein the coating of a layer system in a coating system comprises that an interferometric layer system is deposited on at least one surface of a substrate, wherein the layer system comprises a stack of at least four successive layer packets, wherein each layer packet comprises a pair of first and second individual layers, wherein the first individual layers each have a first optical thickness and the second individual layers each have a second optical thickness, which is different from the first optical thickness, wherein a refractive index of the respective first individual layers, which are closer to the substrate, is greater than a refractive index of the respective second individual layers of the stack, which are further away from the substrate, wherein the layer system has a brightness (L*), a chromaticity (C*), and a hue angle (h) of a residual reflection colour, and wherein the amount of a change (Ah) of the hue angle (h) of the residual reflection colour in an interval of a viewing angle (AOI) with the limit values of 0° and 30° in relation to a surface normal to the layer system is smaller than the amount of a change (AC*) of the chromaticity (C*) in the interval of the viewing angle (AOI), wherein the following steps are carried out:

defining a layer design, comprising at least a first material for highly refractive first individual layers and a second material for low refractive second individual layers, a number of desired layer packets including the individual layers, starting values of the thickness of the individual layers;

defining target colour values, comprising brightness (L*), chromaticity (C*) and hue angle (h), at least at limit values for an interval of a viewing angle (AOI) having the limit values of 0° and 30°; and carrying out an optimisation method to vary the individual layer thicknesses until an optimisation target is reached.

9. The method according to claim 8, wherein the hue angle (h) in the interval of the viewing angle (AOI) having the limit values of 0° and 30° changes by at most 15°; and/or wherein the amount of the change (Ah) of the hue angle (h) in a second interval of a viewing angle (AOI) from 0° to a limit viewing angle (0) having upper limit values between at least 30° and at most 45° in relation to the surface normal on the layer system is less than the amount of a change (AC*) in the chromaticity (C*) in the second interval of the viewing angle (AOI) and the amount of the chromaticity (C*) at the limit viewing angle (0) is at least 2, in particular, wherein the hue angle (h) in the second interval changes by at most 20°; and/or wherein the photopic reflectance (Rv) in the interval of the viewing angle (AOI) having the limit values of 0° and 30° is at most 1.5%; and/or wherein the scotopic reflectance (Rv') in the interval of the viewing angle (AOI) having the limit values of 0° and 30° is at most 1.5%.

10. The method according to claim 1, further comprising the steps of:

computing colour values of a residual reflection colour of the layer system from the actual measuring plot; and filing the actual measuring plot and the computed colour values in the filing database; and documenting the decision on approval in the filing database.

11. The method according to claim 10, further comprising deciding on a coating of a layer system in a coating facility based on a comparison of at least the target data set and approval criteria from the criteria database.

12. The method according to claim 10, wherein the computing of colour values of a residual reflection colour of the layer system from the actual measuring plot further comprises that a brightness (L*), a chromaticity (C*) and a hue angle (h) of the residual reflection colour is determined from the actual measuring plot.

13. The method according to claim 10, wherein the deciding on an approval of the layer system in the decision system comprises an automatic, software-based approval decision, in particular, by using an artificial intelligence method.

14. The method according to claim 10, wherein the determining of an actual data set by fitting a simulation target measuring plot to the actual measuring plot in the simulation computer further comprises:

(i) detecting at least one spectral measuring plot having ordinate values and abscissa values as actual measuring plot at the layer system, which consists of one or more individual layers having respective facility actual layer thicknesses set at the coating facility for the production of the layer system, wherein the one or more individual layers are produced according to a target data set of the at least one coating facility, wherein the target data set comprises at least the facility actual layer thicknesses of the one or more individual layers, which are assigned to the one or more individual layers;

(ii) assigning the actual measuring plot of the layer system according to an assignment criterion, in particular, for significant spectral points of the actual measuring plot, to a target measuring plot of a target data set having ordinate values and abscissa values, which is based on a target layer system, formed from one or more individual layers, wherein the target data set comprises at least one of the known target layer thickness of the one or more individual layers assigned to the respective individual layer;

(iii) generating a simulation actual measuring plot according to an iterative method by varying of at least simulation actual layer thicknesses of the one or more individual layers in at least one spectral interval of the actual measuring plot and receiving of a final simulation actual Data set having at least final simulation actual layer thicknesses assigned to the respective individual layers, through which the actual measuring plot in the simulation actual measuring plot is at least approximated, until a stable result is achieved for the assignment criterion according to a statistical selection method, wherein the target layer thicknesses are used as start values of the simulation actual layer thicknesses; and (iv) generating a simulation target measuring plot according to an iterative method by varying at least the simulation target layer thickness of the one or more individual layers assigned to the respective individual layer in at least one spectral interval of the target measuring plot and receiving of a final simulation target data set having at least final simulation target layer thicknesses assigned to the respective individual layers, through which the target measuring plot in the simulation target measuring plot is at least approximated, until a stable result is achieved for the assignment criterion according to a statistical selection method; wherein the simulation actual layer thicknesses are used as the starting values of the simulation target layer thicknesses, wherein the iterative method is carried out for one or more spectral intervals, wherein each subsequent interval includes the previous interval.

15. The method according to claim 14, wherein the determining of computed actual layer parameters by simulation of the layer system using the actual data set further comprises providing the final simulation target data set for the at least one coating facility as a new facility data set for depositing a further layer system having at least one or more correction actual layer thicknesses for the determining of new facility actual layer thicknesses, which are determined from the final simulation target layer thicknesses with the final simulation target data set.

16. The method according to claim 10, wherein the quality requirement data comprise tolerance values for the target data set of a layer system.

17. The method according to claim 16, wherein the deciding on an approval of the layer system in the decision system comprises an automatic, software-based approval decision, in particular, by using an artificial intelligence method.

18. The method according to claim 10, wherein the approval criteria comprise at least permissible and/or non-permissible layer parameters, in particular, from which requirements are derived, which are used for the comparison with the actual data set and/or the computed actual layer parameters and/or the actual measuring plot.

19. The method according to claim 18, wherein the quality requirement data comprise tolerance values for the target data set of a layer system.

20. The method according to claim 18, wherein the deciding on an approval of the layer system in the decision system comprises an automatic, software-based approval decision, in particular, by using an artificial intelligence method.

21. A computer program product for a method for operating at least one coating system in a self-controlled and feedback mode for producing layer systems, wherein the computer program product comprises at least one non-transitory computer readable storage medium, which comprises program commands that are executable on a computer system and cause the computer system to carry out a method comprising:

(i) coating a substrate with a layer system that includes a plurality of layers in a coating facility to obtain a finished spectacle lens, wherein the substrate is a transparent plastic material for a spectacle lens;

(ii) determining a spectral actual measuring plot for the layer system of the finished spectacle lens in an optical measuring system;

(iii) determining an actual data set by fitting a simulation target measuring plot to the actual measuring plot in the simulation computer by varying physical individual layer thicknesses of the target data set until the actual measuring plot has been met;

(iv) determining actual layer parameters as computed actual layer parameters from the simulation target measuring plot by simulation of the layer system using the actual data set, wherein the determined actual layer parameters include reflection values in wavelength ranges or at angles of incidence outside of the values obtained from the actual measuring plot;

(v) outputting the actual data set and the computed actual layer parameters at least to a decision system;

(vi) after the actual data set and the computed actual layer parameters are obtained from the simulation computer and output to the decision system, loading approval criteria and quality requirement data into the decision system, wherein the approval criteria and quality requirement data are from a criteria database, the approval criteria comprises permissible and/or nonpermissible layer parameters, from which the quality requirement data are derived, and the quality requirement data comprise tolerance values for the target data set; and comparing the actual data set, the computed actual layer parameters, and the quality requirement data; and; and (vii) deciding on an approval of the layer system of the finished spectacle lens in the decision system on the basis of a comparison of at least the actual data set, the computed actual layer parameters and the quality requirement data.

* * * * *